United States Patent
Zi et al.

(10) Patent No.: US 11,942,322 B2
(45) Date of Patent: Mar. 26, 2024

(54) METHOD OF MANUFACTURING SEMICONDUCTOR DEVICES AND PATTERN FORMATION METHOD

(71) Applicant: TAIWAN SEMICONDUCTOR MANUFACTURING CO., LTD., Hsinchu (TW)

(72) Inventors: An-Ren Zi, Hsinchu (TW); Chun-Chih Ho, Taichung (TW); Yahru Cheng, Taipei (TW); Ching-Yu Chang, Yuansun Village (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 47 days.

(21) Appl. No.: 17/226,872

(22) Filed: Apr. 9, 2021

(65) Prior Publication Data

US 2021/0366711 A1    Nov. 25, 2021

Related U.S. Application Data

(60) Provisional application No. 63/028,665, filed on May 22, 2020.

(51) Int. Cl.
*H01L 21/033* (2006.01)
*G03F 7/00* (2006.01)
*G03F 7/20* (2006.01)
*H01L 21/308* (2006.01)

(52) U.S. Cl.
CPC ...... *H01L 21/0334* (2013.01); *G03F 7/70033* (2013.01); *H01L 21/3083* (2013.01)

(58) Field of Classification Search
None
See application file for complete search history.

(56) References Cited

U.S. PATENT DOCUMENTS

| | | |
|---|---|---|
| 8,796,666 B1 | 8/2014 | Huang et al. |
| 9,093,530 B2 | 7/2015 | Huang et al. |
| 9,213,234 B2 | 12/2015 | Chang |
| 9,223,220 B2 | 12/2015 | Chang |
| 9,256,133 B2 | 2/2016 | Chang |
| 9,310,684 B2 * | 4/2016 | Meyers ............. G03F 7/0042 |
| 9,536,759 B2 | 1/2017 | Yang et al. |
| 9,548,303 B2 | 1/2017 | Lee et al. |
| 9,857,684 B2 | 1/2018 | Lin et al. |
| 9,859,206 B2 | 1/2018 | Yu et al. |
| 9,875,892 B2 | 1/2018 | Chang et al. |
| 10,347,486 B1 | 7/2019 | DeSilva et al. |
| 10,845,704 B2 | 11/2020 | Ouyang |

(Continued)

FOREIGN PATENT DOCUMENTS

| | | |
|---|---|---|
| TW | 202018766 A | 5/2020 |
| WO | 2019/217749 A1 | 11/2019 |

*Primary Examiner* — Stephanie P Duclair
(74) *Attorney, Agent, or Firm* — Studebaker & Brackett PC

(57) ABSTRACT

In a method of manufacturing a semiconductor device, a metallic photoresist layer is formed over a target layer to be patterned, the metallic photoresist layer is selectively exposed to actinic radiation to form a latent pattern, and the latent pattern is developed by applying a developer to the selectively exposed photoresist layer to form a pattern. The metallic photo resist layer is an alloy layer of two or more metal elements, and the selective exposure changes a phase of the alloy layer.

20 Claims, 13 Drawing Sheets

(56) References Cited

U.S. PATENT DOCUMENTS

| | | | |
|---|---|---|---|
| 2011/0293888 A1 | 12/2011 | Stowers et al. | |
| 2012/0088369 A1* | 4/2012 | Weidman | H01L 21/0217 |
| | | | 430/296 |
| 2013/0224652 A1* | 8/2013 | Bass | G03F 7/0042 |
| | | | 430/296 |
| 2016/0116839 A1* | 4/2016 | Meyers | G03F 7/32 |
| | | | 430/326 |
| 2017/0271150 A1* | 9/2017 | Chang | G03F 7/11 |
| 2020/0073238 A1 | 3/2020 | Zi et al. | |
| 2020/0326627 A1* | 10/2020 | Jiang | G03F 7/325 |
| 2021/0013034 A1* | 1/2021 | Wu | H01L 21/02348 |

\* cited by examiner

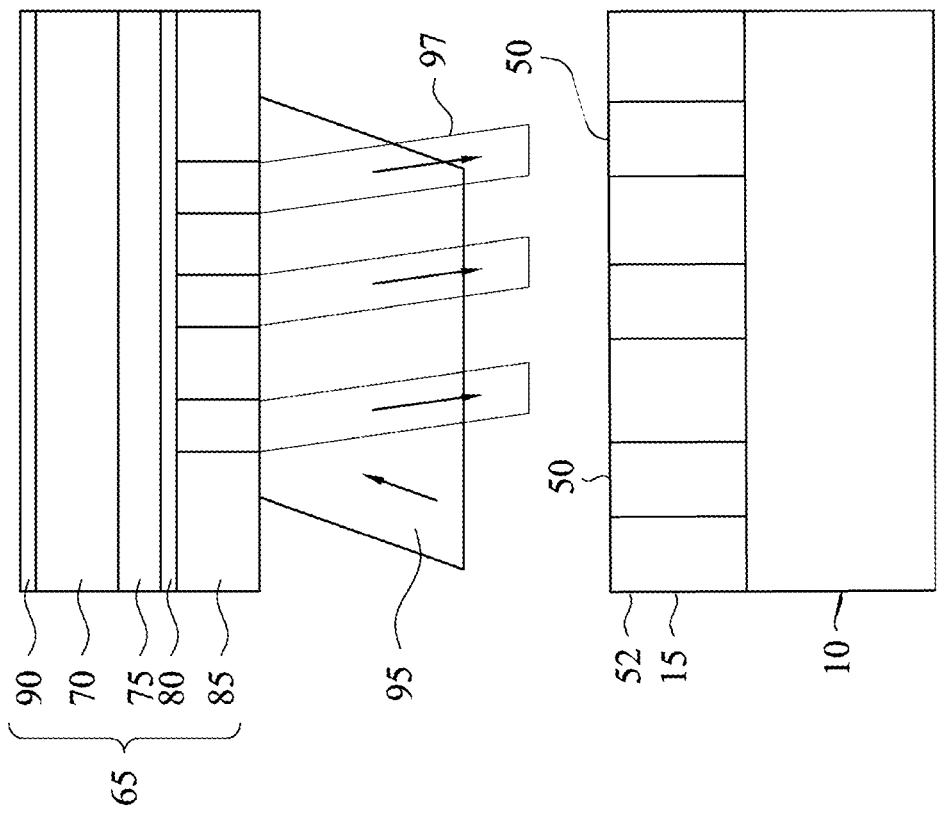
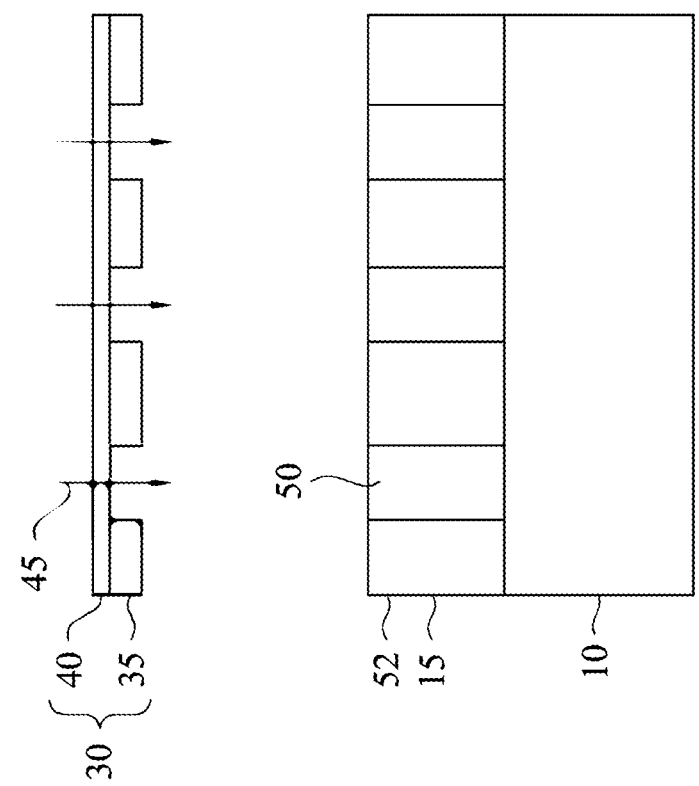
FIG. 3B
FIG. 3A

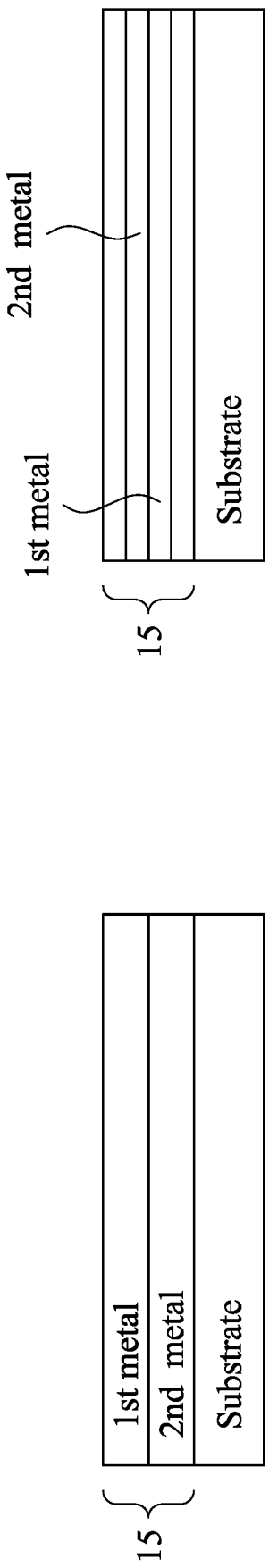
FIG. 7A
FIG. 7B
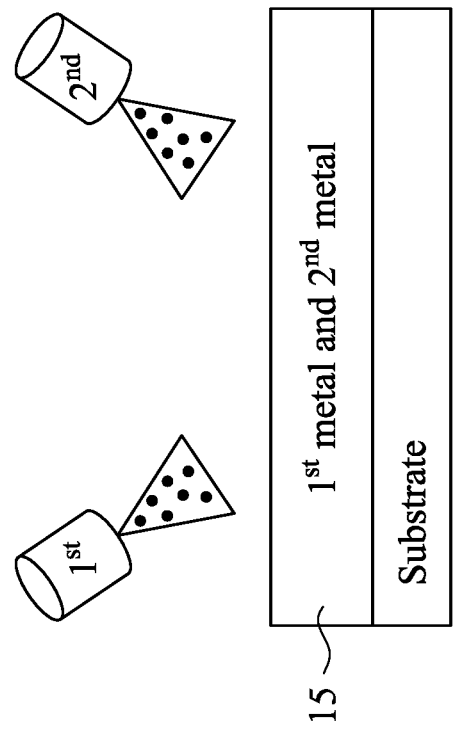
FIG. 7C
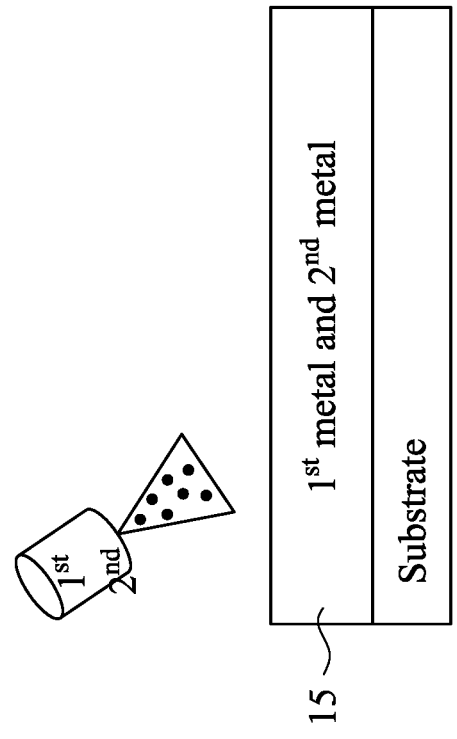
FIG. 7D

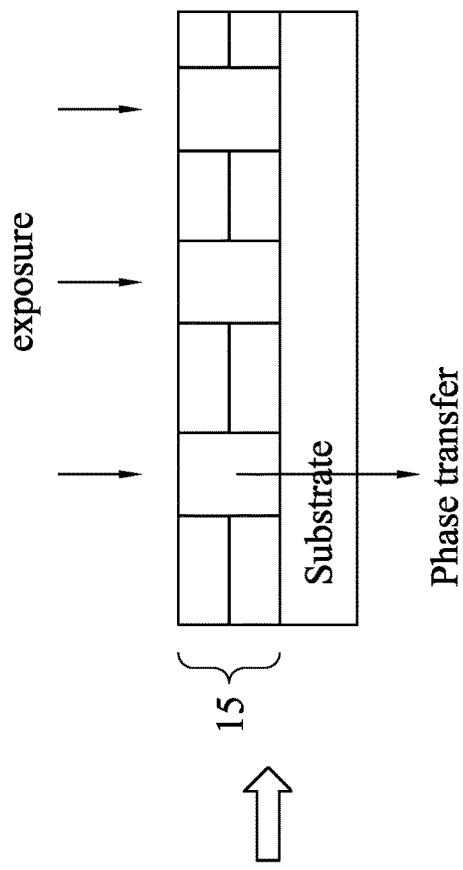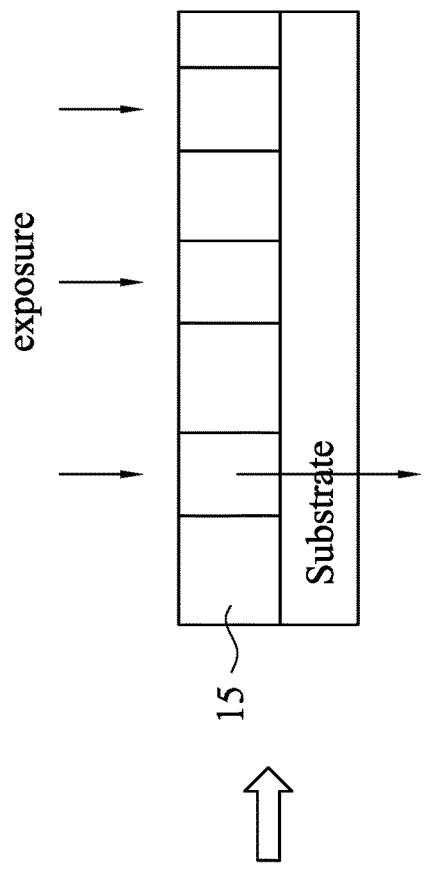
FIG. 8A
FIG. 8B

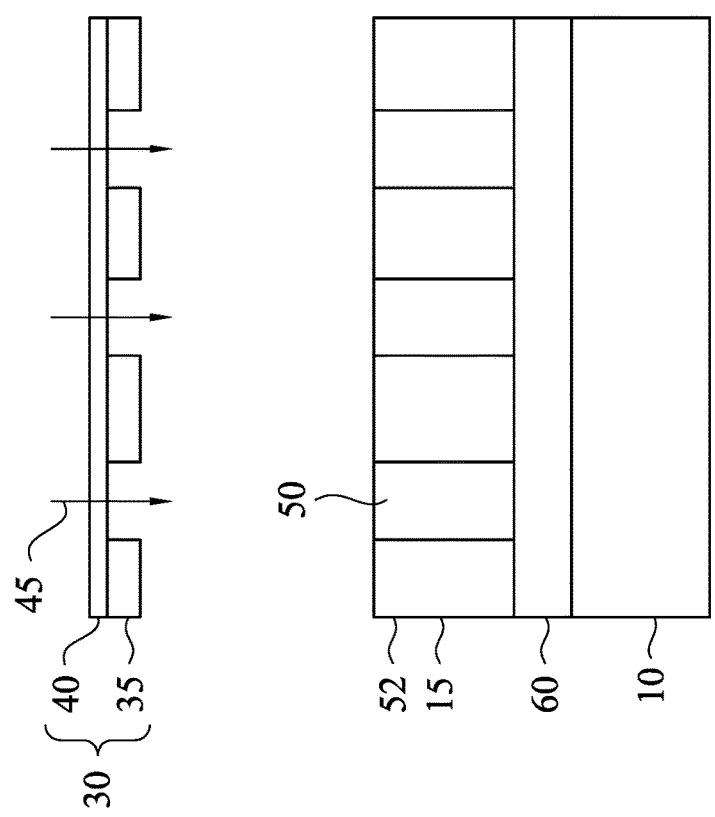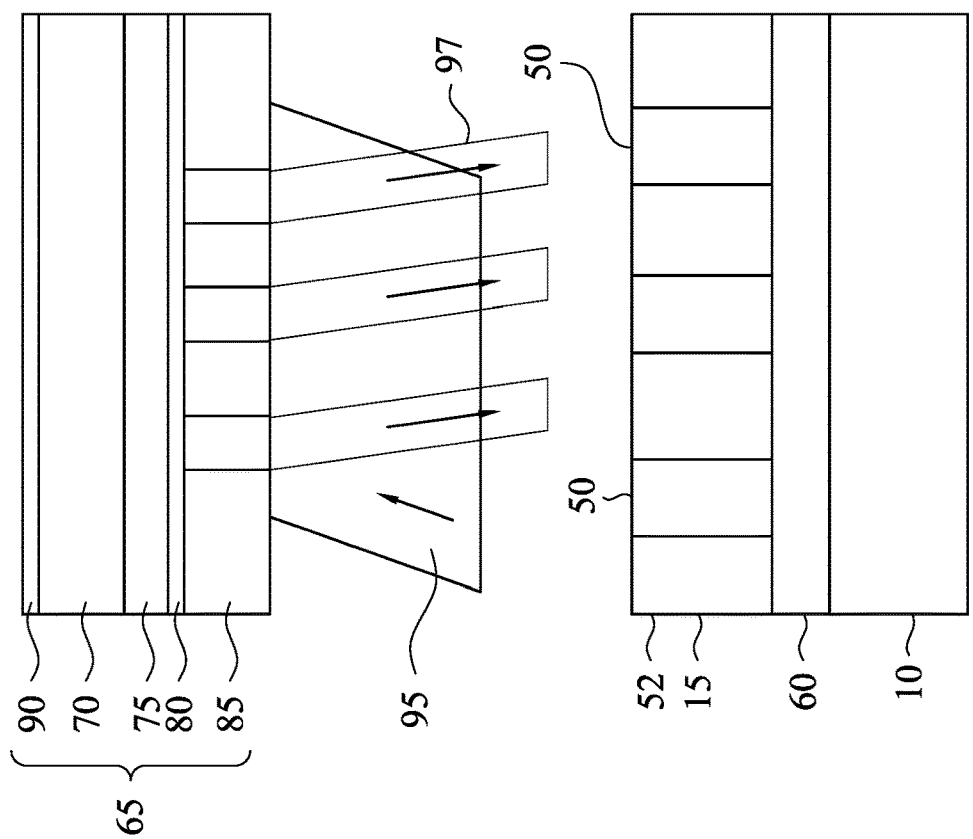
FIG. 11A
FIG. 11B

METHOD OF MANUFACTURING SEMICONDUCTOR DEVICES AND PATTERN FORMATION METHOD

RELATED APPLICATIONS

This application claims priority to U.S. Provisional Patent Application No. 63/028,665 filed May 22, 2020, the entire contents of which are incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A and 3B show a process stage of a sequential operation according to an embodiment of the disclosure.

FIGS. 7A, 7B, 7C and 7D show various stages of forming a metallic resist layer according to embodiments of the disclosure.

FIGS. 8A and 8B show exposure operations of the metallic resist layer according to some embodiments of the disclosure.

FIGS. 11A and 11B show a process stage of a sequential operation according to an embodiment of the disclosure.

DETAILED DESCRIPTION

Figure 1:
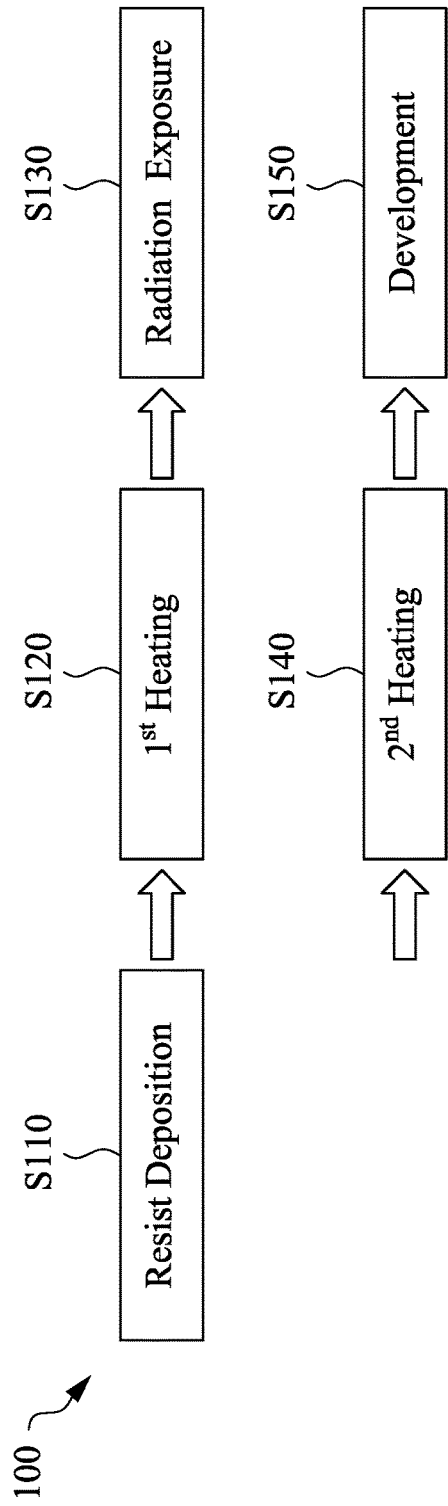
FIG. 1 illustrates a process flow of manufacturing a semiconductor device according to embodiments of the disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

As the semiconductor industry has progressed into nanometer technology process nodes in pursuit of higher device density, higher performance, and lower costs, there have been challenges in reducing semiconductor feature size. Extreme ultraviolet lithography (EUVL) has been developed to form smaller semiconductor device feature size and increase device density on a semiconductor wafer. In order to improve EUVL, an increase in wafer exposure throughput is desirable. Wafer exposure throughput can be improved through increased exposure power or increased resist photospeed (sensitivity).

Metal-containing photoresists are used in extreme ultraviolet (EUV) lithography because metals have a high absorption capacity of extreme ultraviolet radiation and thus increase the resist photospeed. Metal-containing photoresist layers, however, may outgas during processing which can cause the photoresist layer quality to change over time and may cause contamination, thereby negatively affecting lithography performance, and increasing defects.

Furthermore, uneven exposure of the photoresist, especially at deeper portions of the photoresist layer may result in an uneven degree of cross-linking of the photoresist. Uneven exposure results from a lower amount of light energy reaching the lower portions of the photoresist layer. The uneven exposure may result in poor line width roughness (LWR) thereby preventing the formation of a straight edge resist profile.

Further, the solvents used in the formation of and developing solvent-based photoresists may be toxic. A greener process of photoresist layer formation and subsequent pattern formation without using toxic solvents is desirable.

Moreover, a spin coating processes may use only 2-5% of the material dispensed onto the substrate, while the remaining 95-98% is flung off during the spin-coating operation. A photoresist deposition operation with high material use efficiency is desirable.

Furthermore, the density of spin-coated photoresist films may not be uniform. Aggregation of the photoresist film may occur in some portions.

In addition, photoresist layer formation and patterning operations that substantially reduce or prevent metal contamination of the processing chambers and substrate handling equipment from the metals in metal-containing photoresists is desirable.

In embodiments of the disclosure, the above issues are addressed by depositing a photoresist on a substrate by a vapor deposition operation, including atomic layer deposition (ALD), physical vapor deposition (PVD) or chemical vapor deposition (CVD) of the photoresist material. Photoresist layers deposited by a vapor phase deposition operation according to embodiments of the disclosure provide photoresist layers that have controllable film thickness, and high film uniformity and density, over a large deposition area. In addition, embodiments of the disclosure include solvent free photoresist layer formation, thus providing a greener process. Moreover, the photoresist deposition operation is a one-pot method (carried out in a single chamber), thus increasing the manufacturing efficiency, and limiting or preventing metal contamination of processing chambers.

Figure 2:
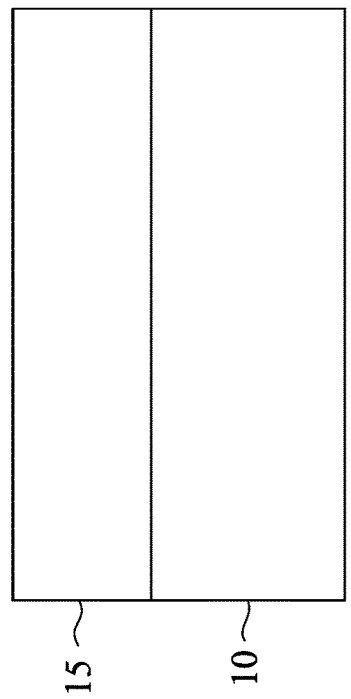
FIG. 2 shows a process stage of a sequential operation according to an embodiment of the disclosure.

FIG. 1 illustrates a process flow 100 of manufacturing a semiconductor device according to embodiments of the disclosure. A resist is coated on a surface of a layer to be patterned or a substrate 10 in operation S110, in some embodiments, to form a resist layer 15, as shown in FIG. 2. In some embodiments, the photo resist 15 is a metallic photoresist formed by CVD, PVD or ALD. The composition of the metallic photoresist is explained later in this disclosure. In some embodiments, the resist layer 15 then undergoes a first heating operation S120 after being deposited. In some embodiments, the resist layer is heated to a temperature of between about 40° C. and about 1000° C. for about 10 seconds to about 10 minutes, and in other embodiments, the heating temperature is in a range from about 250° C. to 800° C.

After the optional first heating operation S120 or the resist deposition operation S110, the photoresist layer 15 is selectively exposed to actinic radiation 45/97 (see FIGS. 3A and 3B) in operation S130. In some embodiments, the photoresist layer 15 is selectively or patternwise exposed to ultraviolet radiation. In some embodiments, the ultraviolet radiation is deep ultraviolet radiation (DUV). In some embodiments, the ultraviolet radiation is extreme ultraviolet (EUV) radiation. In some embodiments, the photoresist layer is selectively or patternwise exposed to an electron beam.

As shown in FIG. 3A, the exposure radiation 45 passes through a photomask 30 before irradiating the photoresist layer 15 in some embodiments. In some embodiments, the photomask has a pattern to be replicated in the photoresist layer 15. The pattern is formed by an opaque pattern 35 on the photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

In some embodiments, the selective or patternwise exposure of the photoresist layer 15 to form exposed regions 50 and unexposed regions 52 is performed using extreme ultraviolet lithography. In an extreme ultraviolet lithography operation a reflective photomask 65 is used to form the patterned exposure light in some embodiments, as shown in FIG. 3B. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion substrate 70. Extreme ultraviolet radiation 95 is directed towards the reflective photomask 65 at an incident angle of about 6°. A portion 97 of the extreme ultraviolet radiation is reflected by the Si/Mo multilayer 75 towards the photoresist-coated substrate 10, while the portion of the extreme ultraviolet radiation incident upon the absorber layer 85 is absorbed by the photomask. In some embodiments, additional optics, including mirrors, are located between the reflective photomask 65 and the photoresist-coated substrate.

In some embodiments, the exposure to radiation is carried out by placing the photoresist-coated substrate in a photolithography tool. The photolithography tool includes a photomask 30/65, optics, an exposure radiation source to provide the radiation 45/97 for exposure, and a movable stage for supporting and moving the substrate under the exposure radiation.

In some embodiments, optics (not shown) are used in the photolithography tool to expand, reflect, or otherwise control the radiation before or after the radiation 45/97 is patterned by the photomask 30/65. In some embodiments, the optics include one or more lenses, mirrors, filters, and combinations thereof to control the radiation 45/97 along its path.

In some embodiments, the radiation is electromagnetic radiation, such as g-line (wavelength of about 436 nm), i-line (wavelength of about 365 nm), ultraviolet radiation, far ultraviolet radiation, extreme ultraviolet, electron beams, or the like. In some embodiments, the radiation source is one or more of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

The amount of electromagnetic radiation can be characterized by a fluence or dose, which is obtained by the integrated radiative flux over the exposure time. Suitable radiation fluences range from about 1 mJ/cm$^2$ to about 150 mJ/cm$^2$ in some embodiments, from about 2 mJ/cm$^2$ to about 100 mJ/cm$^2$ in other embodiments, and from about 3 mJ/cm² to about 50 mJ/cm² in other embodiments. A person of ordinary skill in the art will recognize that additional ranges of radiation fluences within the explicit ranges above are contemplated and are within the present disclosure.

In some embodiments, the selective or patternwise exposure is performed by a scanning electron beam. With electron beam lithography, the electron beam induces secondary electrons, which modify the irradiated material. High resolution is achievable using electron beam lithography and the metal-containing resists disclosed herein. Electron beams can be characterized by the energy of the beam, and suitable energies range from about 5 V to about 200 kV (kilovolt) in some embodiments, and from about 7.5 V to about 100 kV in other embodiments. Proximity-corrected beam doses at 30 kV range from about 0.1 μC/cm² to about 5 μC/cm² in some embodiments, from about 0.5 μC/cm² to about 1 μC/cm² in other embodiments, and in other embodiments from about 1 μC/cm² to about 100 μC/cm². A person of ordinary skill in the art can compute corresponding doses at other beam energies based on the teachings herein and will recognize that additional ranges of electron beam properties within the explicit ranges above are contemplated and are within the present disclosure.

The region of the photo resist layer exposed to radiation 50 undergoes a chemical or structural reaction, thereby changing its susceptibility to being removed in a subsequent development operation S150. In some embodiments, the portion of the photoresist layer exposed to radiation 50 undergoes a reaction making the exposed portion more easily removed during the development operation S150. In other embodiments, the portion of the photoresist layer exposed to radiation 50 undergoes a reaction making the exposed portion resistant to removal during the development operation S150.

Next, the photoresist layer undergoes a second heating or a post-exposure bake (PEB) in operation S140 in some embodiments. In other embodiments, no PEB is performed. In some embodiments, the photoresist layer 15 is heated to a temperature of about 50° C. to about 1000° C. for about 20 seconds to about 120 seconds. In some embodiments, the post-exposure baking is performed at a room temperature (25° C.) or a temperature ranging from about 100° C. to about 250° C., and at a temperature ranging from about 150° C. to about 200° C. in other embodiments.

Figure 4A:
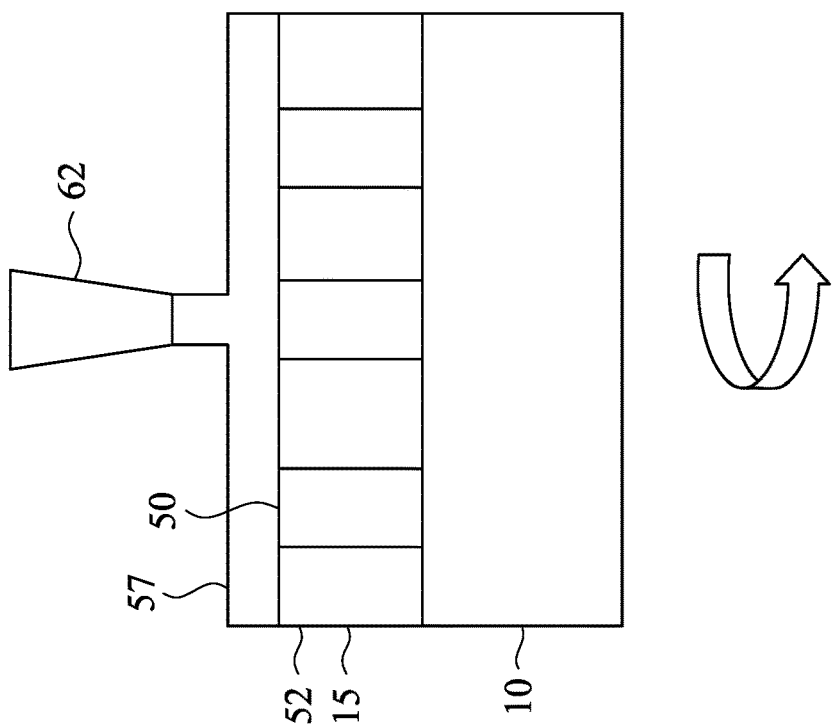
Figure 5:
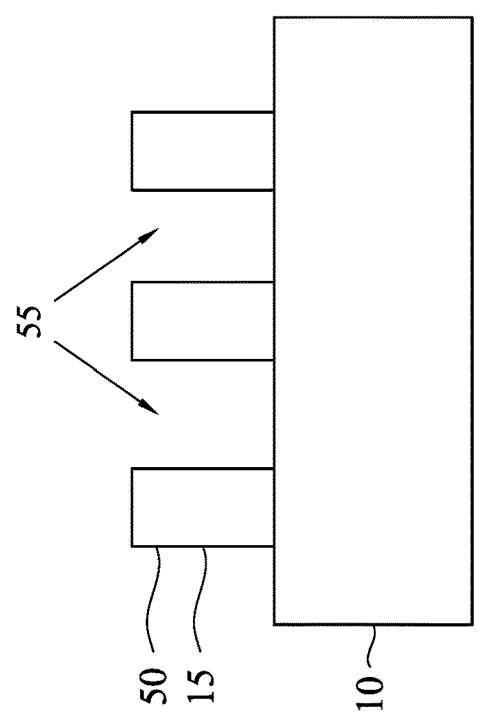
FIG. 5 shows a process stage of a sequential operation according to an embodiment of the disclosure.

The selectively exposed photoresist layer is subsequently developed in operation S150. In some embodiments, the photoresist layer 15 is developed by applying a solvent-based developer 57 to the selectively exposed photoresist layer. As shown in FIG. 4A, a liquid developer 57 is supplied from a dispenser 62 to the photoresist layer 15. In some embodiments, the exposed portions 50 of the photoresist undergo a phase change as a result of the exposure to actinic radiation, and the unexposed portion of the photoresist layer 52 is removed by the developer 57 forming a pattern of openings 55 in the photoresist layer 15 to expose the substrate 20, as shown in FIG. 5. In other embodiments, the exposed portions of the photoresist layer 52 are removed by the developer 57.

In some embodiments, the photoresist developer composition 57 includes a first solvent, an acid or a base. In some embodiments, one or more additional solvents are used with the first solvent. In some embodiments, the concentration of the first solvent is from about 60 wt. % to about 99 wt. % based on the total weight of the photoresist developer composition. In some embodiment, the concentration of the additional solvent is from about 1 wt. % to about 40 wt. % based on the total weight of the developer. In some embodiments, the additional solvent is deionized water.

In some embodiments, the first solvent has Hansen solubility parameters of $5<\delta_d<35$, $5<\delta_p<35$, and $5<\delta_h<45$. The units of the Hansen solubility parameters are $(Joules/cm^3)^{1/2}$ or, equivalently, $MPa^{1/2}$ and are based on the idea that one molecule is defined as being like another if it bonds to itself in a similar way. $\delta_d$ is the energy from dispersion forces between molecules. $\delta_p$ is the energy from dipolar intermolecular force between the molecules. $\delta_h$ is the energy from hydrogen bonds between molecules. The three parameters, $\delta_d$, $\delta_p$, and $\delta_h$, can be considered as coordinates for a point in three dimensions, known as the Hansen space. The nearer two molecules are in Hansen space, the more likely they are to dissolve into each other.

First solvents having the desired Hansen solubility parameters include dimethyl sulfoxide, acetone, ethylene glycol, methanol, ethanol, propanol, propanediol, water, 4-methyl-2-pentanone, hydrogen peroxide, isopropyl alcohol and butyldiglycol.

In some embodiments, the photoresist developer composition 57 includes an additive, which is an acid or a base. The acid or base concentration is from about 0.01 wt. % to about 30 wt. % based on the total weight of the photoresist developer composition. In certain embodiments, the acid or base concentration in the developer is from about 0.1 wt. % to about 15 wt. % based on the total weight of the photoresist developer composition. In certain embodiments, the second solvent concentration in the developer is from about 1 wt. % to about 5 wt. % based on the total weight of the photoresist developer composition. At concentrations of the solvent components outside the disclosed ranges, developer composition performance and development efficiency may be reduced, leading to increased photoresist residue and scum in the photoresist pattern, and increased line width roughness and line edge roughness.

In some embodiments, the acid has an acid dissociation constant, $pK_a$, of $-45<pK_a<6.9$. In some embodiments, the base has a $pK_a$ of $45>pK_a>7.1$. The acid dissociation constant, $pK_a$, is the logarithmic constant of the acid dissociation constant $K_a$. $K_a$ is a quantitative measure of the strength of an acid in solution. $K_a$ is the equilibrium constant for the dissociation of a generic acid according to the equation $HA+H_2O \leftrightarrow A^-+H_3O^+$, where HA dissociates into its conjugate base, $A^-$, and a hydrogen ion which combines with a water molecule to form a hydronium ion. The dissociation constant can be expressed as a ratio of the equilibrium concentrations:

$$K_a = \frac{[A^-][H_3O^+]}{[HA][H_2O]}.$$

In most cases, the amount of water is constant and the equation can be simplified to $HA \leftrightarrow A^-+H^+$, and $$K_a = \frac{[A^-][H^+]}{[HA]}.$$

The logarithmic constant, $pK_a$ is related to $K_a$ by the equation $pK_a=-\log_{10}(K_a)$. The lower the value of $pK_a$ the stronger the acid. Conversely, the higher the value of $pK_a$ the stronger the base.

In some embodiments, suitable acids for the photoresist developer composition 57 include an organic or inorganic acid, which is one or more of acetic acid, ethanedioic acid (oxalic acid), methanoic acid, 2-hydroxypropanoic acid, 2-hydroxybutanedioic acid, citric acid, uric acid, trifluoromethanesulfonic acid, benzenesulfonic acid, ethanesulfonic acid, methanesulfonic acid, maleic acid, carbonic acid, oxoethanoic acid, 2-hydroxyethanoic acid, propanedioic acid, butanedioic acid, 3-oxobutanoic acid, hydroxylamine-O-sulfonic acid, formamidinesulfinic acid, methylsulfamic acid, sulfoacetic acid, 1,1,2,2-tetrafluoroethanesulfonic acid, 1,3-propanedisulfonic acid, nonafluorobutane-1-sulfonic acid, benzenesulfonic acid and 5-sulfosalicylic acid, and combinations thereof. In some embodiments, suitable acids for the photoresist developer composition 57 include an inorganic acid, which is one or more of $HNO_3$, $H_2SO_4$, HCl, or $H_3PO_4$, or combinations thereof.

In some embodiments, suitable bases for the photoresist developer composition 57 include an organic base, which is one or more of monoethanolamine, monoisopropanolamine, 2-amino-2-methyl-1-propanol, 1H-benzotriazole, 1,2,4-triazole, 1,8-diazabicycloundec-7-ene, tetrabutylammonium hydroxide, tetramethylammonium hydroxide, ammonium hydroxide, ammonium sulfamate, ammonium carbamate, tetraethylammonium hydroxide or tetrapropylammonium hydroxide, or combinations thereof.

In some embodiments, the photoresist developer 57 includes a chelate. In some embodiments, the chelate is one or more of ethylenediaminetetraacetic acid (EDTA), ethylenediamine-N,N'-disuccinic acid (EDDS), diethylenetriaminepentaacetic acid (DTPA), polyaspartic acid, trans-1,2-cyclohexanediamine-N,N,N',N'-tetraacetic acid monohydrate, ethylenediamine, or combinations thereof, or the like. In some embodiments, the chelate concentration is from about 0.001 wt. % to about 15 wt. % of the total weight of the photoresist developer.

In some embodiments, the photoresist developer composition 57 includes about 0.00 wt. % to about 3 wt. % of an ionic or non-ionic surfactant to increase the solubility and reduce the surface tension on the substrate.

In some embodiments, the non-ionic surfactant has an A-X or A-X-A-X structure, wherein A is an unsubstituted or substituted with oxygen or halogen, branched or unbranched, cyclic or non-cyclic, saturated C2-C100 aliphatic or aromatic group, and X includes one or more polar functional groups selected from the group of —OH, =O, —S—, —P—, —P(O$_2$), —C(=O)SH, —C(=O)OH, —C(=O)OR—, —O—; —N—, —C(=O)NH, —SO$_2$OH, —SO$_2$SH, —SOH, —SO$_2$—, —CO—, —CN—, —SO—, —CON—, —NH—, —SO$_3$NH—, and SO$_2$NH. In some embodiments, the non-ionic surfactant is one or more selected from the group of

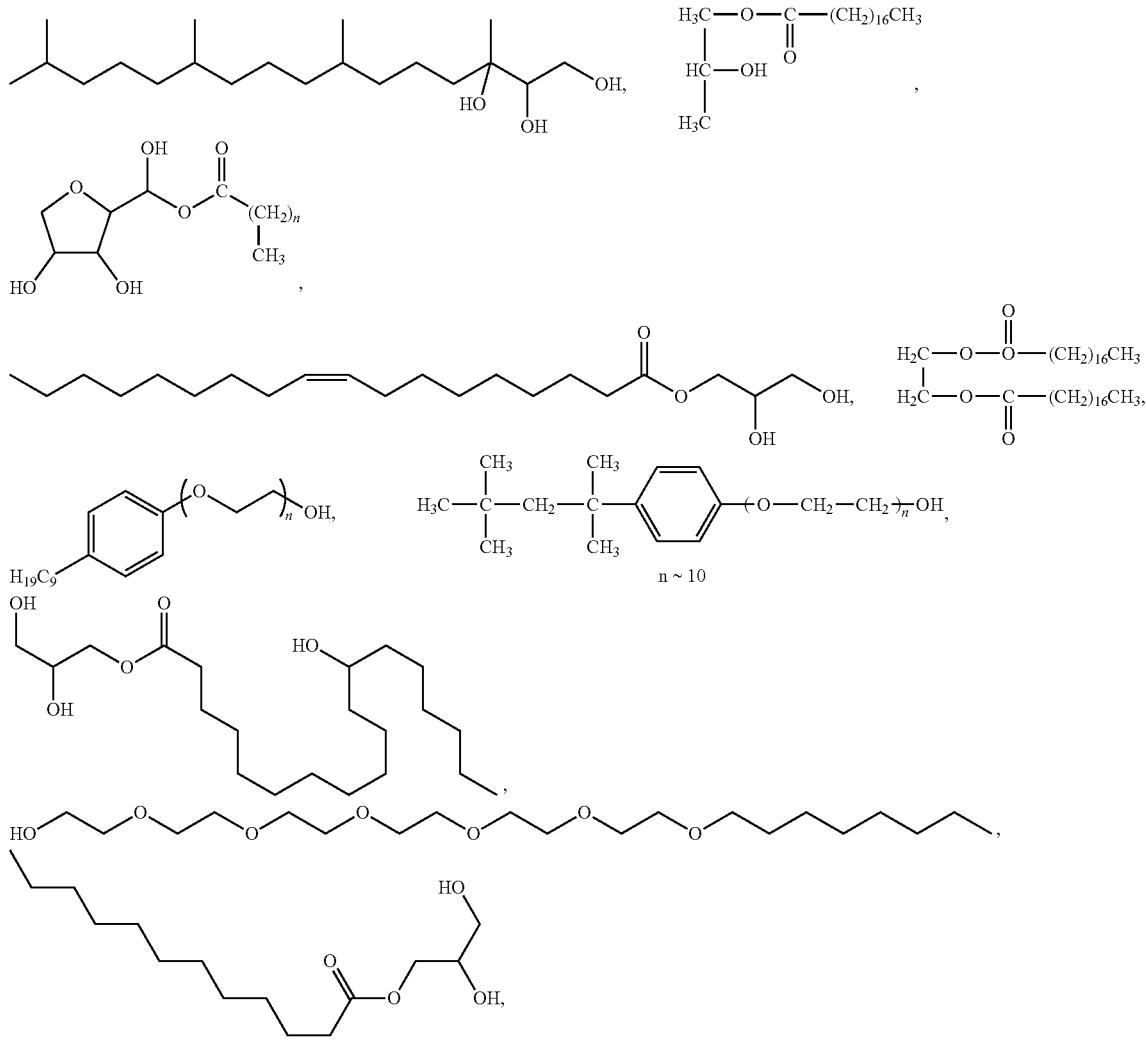

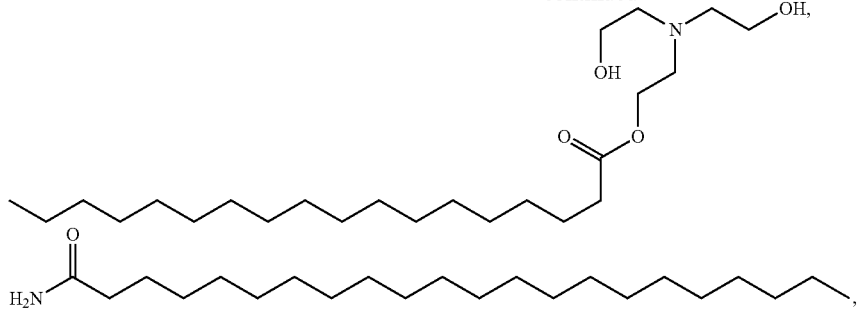

wherein n is the number of repeat units.

In some embodiments, the surfactant includes one or more of a polyethylene oxide or polypropylene oxide, selected from the group consisting of

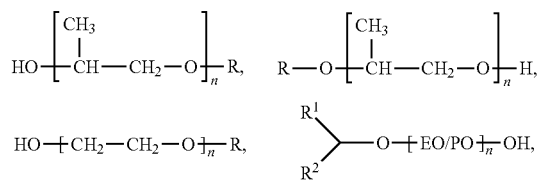

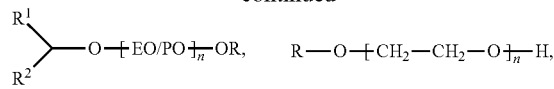

wherein n is the number of repeat units; R, $R^1$, and $R^2$ are same or different, and are substituted or unsubstituted aliphatic, alicyclic, or aromatic groups; and EO/PO is ethylene oxide, propylene oxide, or a copolymer of ethylene oxide and propylene oxide. In some embodiments, R, $R^1$, and $R^2$ are a substituted or unsubstituted C1-C25 alkyl, C1-C25 aryl, or C1-C25 aralkyl, or the like.

The ionic surfactant is one or more selected from the group of

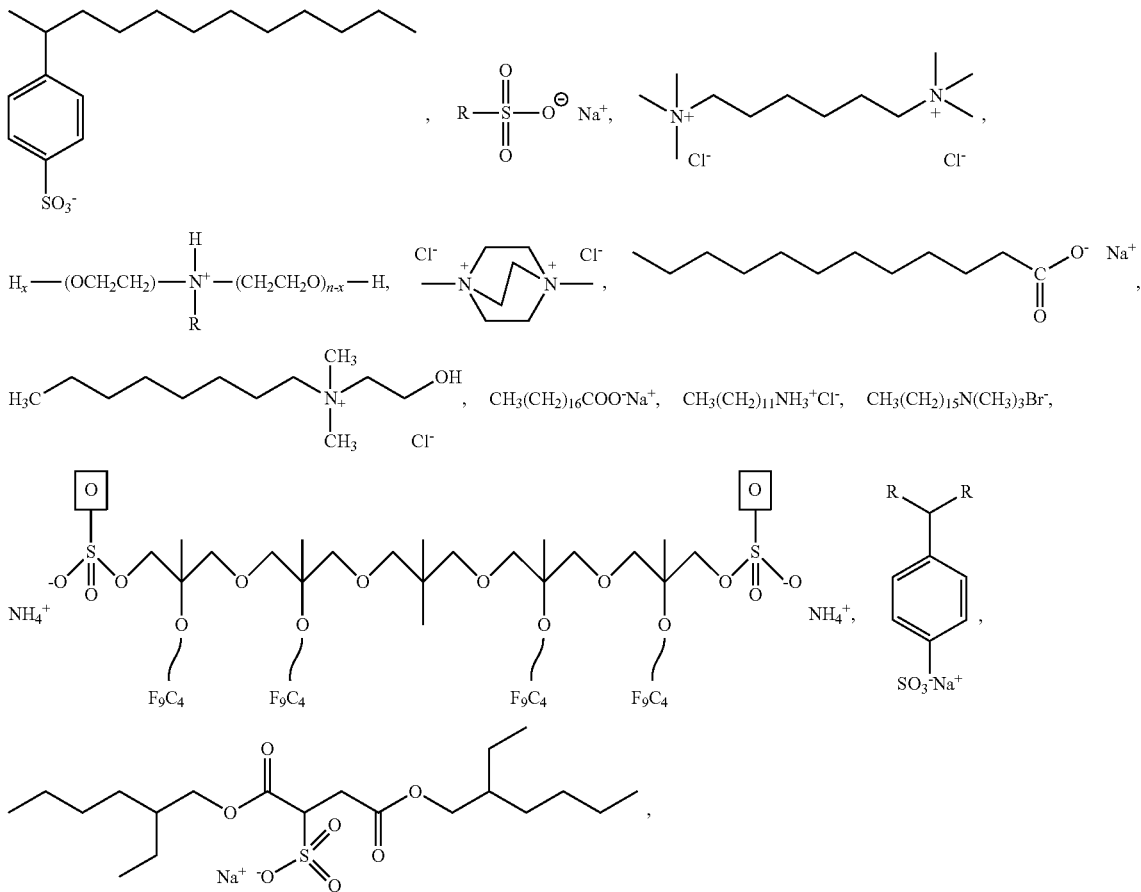

wherein R is an substituted or unsubstituted aliphatic, alicyclic, or aromatic group. In some embodiments, R is a substituted or unsubstituted C1-C12 alkyl, C1-C12 aryl, or C1-C12 aralkyl, or the like.

In some embodiments, the developer 57 includes $H_2O_2$ in an amount of about 0.001 wt. % to about 10 wt. % based on the total weight of the photoresist developer composition to enhance performance.

In some embodiments, the developer 57 is applied to the photoresist layer 15 using a spin-on process. In the spin-on process, the developer 57 is applied to the photoresist layer 15 from above the photoresist layer 15 while the photoresist coated substrate is rotated, as shown in FIG. 4A. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 25° C. and about 75° C. during the development operation. The development operation continues for between about 10 seconds to about 10 minutes in some embodiments.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

In some embodiments during the development process, the developer composition 57 dissolves the photoresist regions 50 not exposed to radiation (i.e.—not phase changed), exposing the surface of the substrate 10, as shown in FIG. 5, and leaving behind well-defined exposed photoresist regions 52, having improved definition than provided by conventional negative tone photoresist photolithography. In other embodiments, the developer composition 57 dissolves the photoresist regions 50 exposed to radiation (a positive tone resist).

Figure 6:
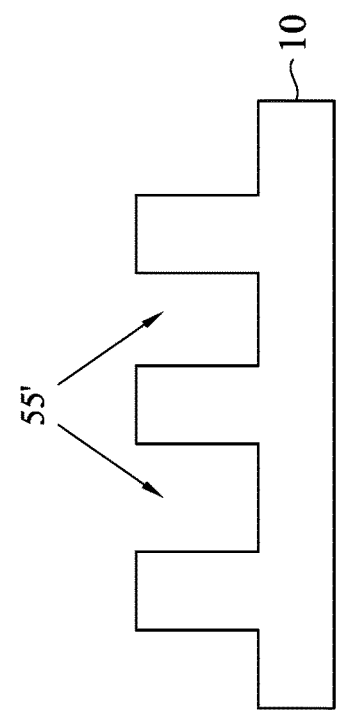
FIG. 6 shows a process stage of a sequential operation according to an embodiment of the disclosure.

After the developing operation S150, remaining developer is removed from the patterned photoresist covered substrate. The remaining developer is removed using a spin-dry process in some embodiments, although any suitable removal technique may be used. After the photoresist layer 15 is developed, and the remaining developer is removed, additional processing is performed while the patterned photoresist layer 52 is in place. For example, an etching operation, using dry or wet etching, is performed in some embodiments, to transfer the pattern of the photoresist layer 52 to the underlying substrate 10, forming recesses 55' as shown in FIG. 6. The substrate 10 has a different etch resistance than the photoresist layer 15. In some embodiments, the etchant is more selective to the substrate 10 than the photoresist layer 15.

In some embodiments, the substrate 10 and the photoresist layer 15 contain at least one etching resistance molecule. In some embodiments, the etching resistant molecule includes a molecule having a low Onishi number structure, a double bond, a triple bond, silicon, silicon nitride, titanium, titanium nitride, aluminum, aluminum oxide, silicon oxynitride, combinations thereof, or the like.

Figure 4B:
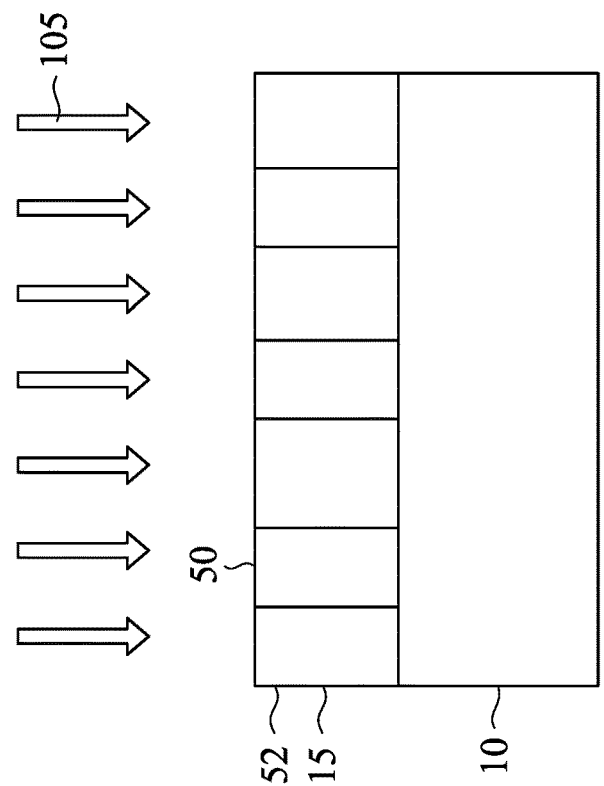
FIGS. 4A and 4B show a process stage of a sequential operation according to an embodiment of the disclosure.

In some embodiments, a dry developer 105 is applied to the selectively exposed photoresist layer 15, as shown in FIG. 4B. In some embodiments, the dry developer 105 is a plasma or chemical vapor, and the dry development operation S150 is a plasma etching or chemical etching operation.

The dry development uses the differences related to the structures, crystalline phases, to selectively remove the desired portions of the resist. In some embodiments, the dry development processes uses either a gentle plasma (high pressure, low power) or a thermal process in a heated vacuum chamber while flowing a dry development chemistry, at least one selected from the group of $Cl_2$, $CHCl_3$, $CH_2Cl_2$, $CH_4$, $CF_4$, $N_2$, $BCl_3$, $CCl_4$, HCl, $O_2$, $NF_3$, $NH_3$, $N_2H_2$, HBr and $NO_2$. In some embodiments, the dry developer is $BCl_3$ and the $BCl_3$ removes the unexposed material, leaving behind a pattern of the exposed film that is transferred into the underlying layers by plasma-based etch processes.

In some embodiments, the dry development includes plasma processes, including transformer coupled plasma (TCP), inductively coupled plasma (ICP) or capacitively coupled plasma (CCP). In some embodiments, the plasma process is conducted at a pressure of ranging from about 5 mTorr to a pressure of about 20 mTorr, at a power level from about 250 W to about 1000 W, temperature ranging from about 0° C. to about 300° C., and at flow rate of about 100 to about 1000 sccm, for about 1 to about 3000 seconds.

After the development operation, additional processing is performed while the patterned photoresist layer 50 is in place. For example, an etching operation, using dry or wet etching, is performed in some embodiments, to transfer the pattern of the photoresist layer 50 to the underlying substrate 10, forming recesses 55' as shown in FIG. 6. The substrate 10 has a different etch resistance than the photoresist layer 15. In some embodiments, the etchant is more selective to the substrate 10 than the photoresist layer 15.

In some embodiments, the exposed photoresist layer 15 is at least partially removed during the etching operation in some embodiments. In other embodiments, the exposed photoresist layer 15 is removed after etching the substrate 10 by selective etching, using a suitable photoresist stripper solvent, or by a photoresist plasma ashing operation.

In some embodiments, the substrate 10 includes a single crystalline semiconductor layer on at least it surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes one or more layers of at least one metal, metal alloy, and metal-nitride/sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric material having at least a silicon or metal oxide or nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, and combinations thereof.

In some embodiments, a bottom antireflective coating (BARC) layer is formed between the substrate and the metallic photoresist layer 15.

The photoresist layer 15 is a photosensitive layer that is patterned by exposure to actinic radiation. Typically, the chemical and/or structural properties of the photoresist regions struck by incident radiation change in a manner that depends on the type of photoresist used. Photoresist layers 15 are either positive tone resists or negative tone resists. A positive tone resist refers to a photoresist material that when developed, the portions of the photoresist layer exposed to actinic radiation, such as UV light, are removed, while the region of the photoresist that is non-exposed (or exposed less) remains on the substrate after the development operation. A negative tone resist, on the other hand, refers to a photoresist material that when developed, the portions of the photoresist exposed to actinic radiation remain on the substrate after the development operation, while the region of the photoresist that is non-exposed (or exposed less) is removed during the development operation.

In some embodiments, the metallic photoresist layer 15 is a metal alloy layer or two or more layers of metal elements, including at least two metal elements selected from the group of Ag, Cd, In, Sn, Sb, Te, Cs, Au, Hg, Tl, Pb, Bi, Po and At. In some embodiments, the alloy layer is a binary alloy or a ternary alloy. In some embodiments, the metallic photo resist layer 15 contains no organic material and no organic or inorganic polymer.

In some embodiments, when the alloy layer of the metallic photoresist layer 15 is exposed to an EUV or DUV radiation, the exposed portion of the alloy layer changes its phase, causing different dissolution rates and/or etching rates to a developer between the exposed region and the unexposed region. In some embodiments, the alloy layer changes its phase from an amorphous phase or two separate layers to a crystalline phase or a polycrystalline phase of one layer. In some embodiments, the exposure to the EUV or DUV radiation fully changes the exposed portions of the structure to the crystalline or polycrystalline, and in other embodiments, the exposure only partially changes the exposed portions of the structure to the crystalline or polycrystalline (collectively crystalline), for example, 50% to less than 100%.

In some embodiments, the metallic photoresist layer 15 is an alloy of Sn and Sb. In some embodiments, an impurity level (e.g., additional elements) of the Sn—Sb alloy is less than 0.01 atomic % (including zero). In certain embodiments, the alloy includes about 47-49 atomic % of Sn and about 51-53 atomic % of Sb. When the Sn—Sb alloy layer is exposed to an EUV or DUV radiation, the alloy layer changes its phase from non-β(SnSb) crystalline phase, e.g., an amorphous phase, to the β(SnSb) crystalline phase. In some embodiments, the Sn—Sb alloy is formed or annealed at room temperature (25° C.) or a temperature in a range from about 350° C. to about 450° C. In some embodiments, the metallic photoresist layer 15 as deposited includes one or more alternating layers of Sn and one or more layers of Sb, and by the EUV or DUV radiation, the layers become the crystalline as indicated above.

In some embodiments, the alloy includes about 56-58 atomic % of Sn and about 42-44 atomic % of Sb. When the Sn—Sb alloy layer is exposed to an EUV or DUV radiation, the alloy layer changes its phase from non-$Sb_2Sn_3$ crystalline phase, e.g., an amorphous phase, to the $Sb_2Sn_3$ crystalline phase. In some embodiments, the Sn—Sb alloy is formed or annealed at room temperature (25° C.) or a temperature in a range from about 325° C. to about 400° C. In some embodiments, the metallic photoresist layer 15 as deposited includes one or more alternating layers of Sn and Sb, and by the EUV or DUV radiation, the layers become the crystalline as indicated above.

In some embodiments, the metallic photoresist layer 15 is an alloy of Sn and Ag. In some embodiments, an impurity level (e.g., additional elements) of the Sn—Ag alloy is less than 0.01 atomic % (including zero). In certain embodiments, the alloy includes about 9-16 atomic % of Sn and about 84-91 atomic % of Ag. When the Sn—Ag alloy layer is exposed to EUV or DUV radiation, the alloy layer changes its phase from non-ζ($Ag_4Sn$) crystalline phase, e.g., an amorphous phase, to the ζ($Ag_4Sn$) crystalline phase. In some embodiments, the Sn—Ag alloy is formed or annealed at a room temperature (25° C.) or a temperature in a range from about 600° C. to about 800° C. In some embodiments, the metallic photoresist layer 15 as deposited includes one or more layers of Sn and one or more layers of Ag, and by the EUV or DUV radiation, the layers become the crystalline as indicated above.

In some embodiments, the alloy includes about 24-26 atomic % of Sn and about 74-76 atomic % of Ag. When the Sn—Ag alloy layer is exposed to EUV or DUV radiation, the alloy layer changes its phase from non-$Ag_3Sn$ crystalline phase, e.g., an amorphous phase, to the $Ag_3Sn$ crystalline phase. In some embodiments, the Sn—Ag alloy is formed or annealed at a room temperature (25° C.) or a temperature in a range from about 480° C. to about 725° C. In some embodiments, the metallic photoresist layer 15 as deposited includes one or more layers of Sn and one or more layers of Ag, and by the EUV or DUV radiation, the layers become crystalline as indicated above.

In some embodiments, the metallic photoresist layer 15 is an alloy of Sn and In. In some embodiments, an impurity level (e.g., additional elements) of the Sn—In alloy is less than 0.01 atomic % (including zero). In certain embodiments, the alloy includes about 17-28 atomic % of Sn and about 72-83 atomic % of In. When the Sn—In alloy layer is exposed to EUV or DUV radiation, the alloy layer changes its phase from non-β($In_4Sn$) crystalline phase, e.g., an amorphous phase, to the β($In_4Sn$) crystalline phase. In some embodiments, the Sn—In alloy is formed or annealed at a room temperature (25° C.) or a temperature in a range from about 120° C. to about 150° C. In some embodiments, the metallic photoresist layer 15 as deposited includes one or more alternating layers of Sn and In, and by the EUV or DUV radiation, the layers become crystalline as indicated above.

In some embodiments, the alloy includes about 72-86 atomic % of Sn and about 14-28 atomic % of In. When the Sn—In alloy layer is exposed to EUV or DUV radiation, the alloy layer changes its phase from non-γ($InSn_4$) crystalline phase, e.g., an amorphous phase, to the γ($InSn_4$) crystalline phase. In some embodiments, the Sn—Ag alloy is formed at room temperature (25° C.) or a temperature in a range from about 130° C. to about 225° C. In some embodiments, the metallic photoresist layer 15 as deposited includes one or more alternating layers of Sn and In, and by the EUV or DUV radiation, the layers become crystalline as indicated above. In some embodiments, during the EUV or DUV radiation, the photo resist layer is heated at a temperature from the room temperature or about 50° C. to about 130° C.

In some embodiments, the metallic photoresist layer 15 is an alloy of Sn and Te. In some embodiments, an impurity level (e.g., additional elements) of the Sn—Te alloy is less than 0.01 atomic % (including zero). In certain embodiments, the alloy includes about 48-52 atomic % of Sn and about 48-52 atomic % of Te. When the Sn—Te alloy layer is exposed to EUV or DUV radiation, the alloy layer changes its phase from non-SnTe crystalline phase, e.g., an amorphous phase, to the SnTe crystalline phase. In some embodiments, the Sn—In alloy is formed or annealed at room temperature (25° C.) or a temperature in a range from about 500° C. to about 1000° C. In some embodiments, the metallic photoresist layer 15 as deposited includes one or more alternating layers of Sn and Te, and by the EUV or DUV radiation, the layers become crystalline as indicated above.

In some embodiments, the metallic photoresist layer 15 is an alloy of Ag and Sb. In some embodiments, an impurity level (e.g., additional elements) of the Ag—Sb alloy is less than 0.01 atomic % (including zero). In certain embodiments, the alloy includes about 9-16 atomic % of Sb and about 84-91 atomic % of Ag. When the Ag—Sb alloy layer is exposed to EUV or DUV radiation, the alloy layer changes its phase from non-$\zeta(Ag_4Sb)$ crystalline phase, e.g., an amorphous phase, to the $\zeta(Ag_4Sb)$ crystalline phase. In some embodiments, the Sn—In alloy is formed or annealed at room temperature (25° C.) or a temperature in a range from about 550° C. to about 700° C. In some embodiments, the metallic photoresist layer 15 as deposited includes one or more alternating layers of Ag and Sb, and by the EUV or DUV radiation, the layers become crystalline as indicated above.

In some embodiments, the alloy includes about 22-26 atomic % of Sb and about 74-78 atomic % of Ag. When the Ag—Sb alloy layer is exposed to EUV or DUV radiation, the alloy layer changes its phase from non-$\epsilon'(Ag_3Sb)$ crystalline phase, e.g., an amorphous phase, to the $\epsilon'(Ag_3Sb)$ crystalline phase. In some embodiments, the Sn—Ag alloy is formed or annealed at a room temperature (25° C.) or a temperature in a range from about 440° C. to about 550° C. In some embodiments, the metallic photoresist layer 15 as deposited includes one or more alternating layers of Ag and Sb, and by the EUV or DUV radiation, the layers become crystalline as indicated above.

In some embodiments, the metallic photoresist layer 15 is an alloy of Sn, Ag and Sb. In some embodiments, an impurity level (e.g., additional elements) of the Sn—Ag—Sb alloy is less than 0.01 atomic % (including zero). In certain embodiments, the alloy includes about 0.1-75 atomic % of Ag and the rest is Sb and Sn. When the Sn—Ag—Sb alloy layer is exposed to EUV or DUV radiation, the alloy layer changes its etching resistance, light absorption, dissolution rate and/or phase stability. In some embodiments, the metallic photoresist layer 15 as deposited includes one or more alternating layers of Ag, Sn, and Sb, and by the EUV or DUV radiation, the layers changes its phase as indicated above.

FIGS. 7A-7B shows various deposition method of forming a metallic photoresist layer 15 over the substrate according to embodiments of the present disclosure.

In some embodiments, as shown in FIG. 7A, the metallic photoresist layer 15 is a binary system and the as deposited layer includes a first layer of the first metal (e.g., Sn) and a second layer of the second metal (e.g., Sb or Ag) subsequently formed on the first layer. In some embodiments, the first and second layers are formed by CVD, ALD or PVD. In some embodiments, the precursors for the CVD and ALD are organometallic compounds. In some embodiments, a thickness of the first layer and the second layer is in a range from about 1 nm to about 50 nm, respectively, and in other embodiments, is in a range from about 2 nm to about 20 nm, respectively. The thickness ratio of the first layer (e.g., Sn) and the second layer (e.g., Sb or Ag) is adjusted to obtain the desired elemental ratio as set forth above. For example, to obtain an alloy including about 47-49 atomic % of Sn and about 51-53 atomic % of Sb, the ratio of the thickness of the Sn layer and the thickness of the Sb layer is about 47:53 to about 49:51. The deposition order of the first layer and the second layer can be interchanged.

In some embodiments, as shown in FIG. 7B, the metallic photoresist layer 15 is a binary system and the as deposited layer includes two or more first layers of the first metal (e.g., Sn) and two or more second layer of the second metal (e.g., Sb or Ag) alternately formed. In some embodiments, the first and second layers are formed by CVD, ALD or PVD. In some embodiments, the precursors for the CVD and ALD are organometallic compounds. In some embodiments, a thickness of each of the first layer and the second layer is in a range from about 0.5 nm to about 25 nm, respectively, and is in a range from about 1 nm to about 10 nm in other embodiments, respectively. The ratio of the total thickness of the first layers (e.g., Sn) and the total thickness of the second layers (e.g., Sb or Ag) is adjusted to obtain the desired elemental ratio as set forth above. For example, to obtain an alloy including about 47-49 atomic % of Sn and about 51-53 atomic % of Sb, the ratio of the total thickness of the Sn layers and the total thickness of the Sb layers is about 47:53 to about 49:51. The deposition order of the first layer and the second layer can be interchanged. In some embodiments, the thickness of the first layers and/or the second layers vary. The total number of layers is three to ten in some embodiments.

In some embodiments, as shown in FIG. 7C, the metallic photoresist layer 15 is a binary system and is formed by a sputtering method using an alloy target of the first metal and the second metal. The alloy has the desired elemental ratio as set forth above. In some embodiments, a thickness of the metallic photoresist layer 15 is in a range from about 1 nm to about 100 nm, and is in a range from about 2 nm to about 20 nm in other embodiments. In some embodiments, the as-deposited layer 15 is amorphous.

In some embodiments, as shown in FIG. 7D, the metallic photoresist layer 15 is a binary system and is formed by a sputtering method using a first target of the first metal and a second target of the second metal. By adjusting sputtering conditions (sputtering time/power to the respective targets), the alloy layer as formed over the substrate has the desired elemental ratio as set forth above. In some embodiments, a thickness of the metallic photoresist layer 15 is in a range from about 1 nm to about 100 nm, and is in a range from about 2 nm to about 20 nm in other embodiments. In some embodiments, the as-deposited layer 15 is amorphous. In some embodiments, the metallic photoresist layer 15 of the alloy of the first element and the second element is formed by a CVD method using precursors of the first metal and the second metal, respectively. In some embodiments, the precursors are organometallic compounds.

When the target metallic photoresist layer 15 is a ternary system, three layers of respective elements are formed in FIGS. 7A and 7B, a ternary alloy target is used in FIG. 7C, and three different targets or three different precursors are used in FIG. 7D.

In some embodiments, the operation S110 of depositing a metallic photoresist is performed by a vapor phase deposition operation. In some embodiments, the vapor phase deposition operation includes atomic layer deposition (ALD) or chemical vapor deposition (CVD). In some embodiments, the ALD includes plasma-enhanced atomic layer deposition (PE-ALD), and the CVD includes plasma-enhanced chemical vapor deposition (PE-CVD), metal-organic chemical vapor deposition (MO-CVD); atmospheric pressure chemical vapor deposition (AP-CVD), and low pressure chemical vapor deposition (LP-CVD). The depositing a metallic photoresist layer includes combining the first compound or first precursor and the second compound or second precursor (or third precursor or more) in a vapor state to form the metallic photoresist layer. In some embodiments, the first compound or first precursor and the second compound or second precursor of the metallic photoresist layer are introduced into the deposition chamber (CVD chamber) at about the same time. In some embodiments, the first compound or first precursor and second compound or second precursor are introduced into the deposition chamber (ALD chamber) in an alternating manner, i.e.—first one compound or precursor then a second compound or precursor, and then subsequently alternately repeating the introduction of the one compound or precursor followed by the second compound or precursor.

In a CVD process according to some embodiments of the disclosure, two or more gas streams, in separate inlet paths, of an organometallic precursor and a second precursor are introduced to the deposition chamber of a CVD apparatus, where they mix and react in the gas phase, to form a reaction product. The streams are introduced using separate injection inlets or a dual-plenum showerhead in some embodiments. The deposition apparatus is configured so that the streams of organometallic precursor and second precursor are mixed in the chamber, allowing the organometallic precursor and second precursor to react to form a reaction product. Without limiting the mechanism, function, or utility of the disclosure, it is believed that the product from the vapor-phase reaction becomes heavier in molecular weight, and is then condensed or otherwise deposited onto the substrate.

In some embodiments, an ALD process is used to deposit the photoresist layer. During ALD, a layer is grown on a substrate by exposing the surface of the substrate to alternate gaseous compounds (or precursors). In ALD, the precursors are introduced as a series of sequential, non-overlapping pulses. In each of these pulses, the precursor molecules react with the surface in a self-limiting way, so that the reaction terminates once all the reactive sites on the surface are consumed. Consequently, the maximum amount of material deposited on the surface after a single exposure to all of the precursors (a so-called ALD cycle) is determined by the nature of the precursor-surface interaction.

In an embodiment of an ALD process, an organometallic precursor is pulsed to deliver the metal-containing precursor to the substrate surface in a first half reaction. In some embodiments, the organometallic precursor reacts with a suitable underlying species to form a new self-saturating surface. Excess unused reactants and the reaction by-products are removed, by an evacuation-pump down and/or by a flowing an inert purge gas in some embodiments. Then, a second precursor is pulsed to the deposition chamber in some embodiments. The second precursor reacts with the organometallic precursor on the substrate to obtain a reaction product photoresist on the substrate surface. The second precursor also forms self saturating bonds with the underlying reactive species to provide another self-limiting and saturating second half reaction. A second purge is performed to remove unused reactants and the reaction by-products in some embodiments. Pulses of the first precursor and second precursor are alternated with intervening purge operations until a desired thickness of the photoresist layer 15 is achieved.

In some embodiments, the vapor phase deposition is physical vapor deposition (PVD) including sputtering. In the sputtering method, one or more metal or alloy targets for the desired metal elements or alloy are placed in a vacuum chamber. The target is sputtered by an electron beam, an ion beam and/or plasma to generate vapor of the target material and the vapor is deposited on the substrate.

In some embodiments, the deposition chamber temperature of the CVD, ALD or PVD ranges from about 25° C. to about 1000° C. during the deposition operation, and between about 150° C. to about 750° C. in other embodiments. In some embodiments, the pressure in the deposition chamber ranges from about 5 mTorr to about 100 Torr during the deposition operation, and between about 100 mTorr to about 10 Torr in other embodiments. In some embodiments, the plasma power is less than about 1000 W. In some embodiments, the plasma power ranges from about 100 W to about 900 W. In some embodiments, the flow rate of the first compound or precursor and the second compound or precursor ranges from about 100 sccm to about 1000 sccm. At operating parameters outside the above recited ranges, unsatisfactory photoresist layers result in some embodiments. In some embodiments, the photoresist layer formation occurs in a single chamber (a one-pot layer formation).

In some embodiments, after the deposition, the deposited film is optionally subjected to an annealing operation at a temperature in a range from about 40° C. and about 1000° C. for about 10 seconds to about 10 minutes, and in other embodiments, the heating temperature is in a range from about 250° C. to about 800° C. in an inert gas (Ar, He and/or $N_2$) ambient. The annealing operation may reduce or remove defects in the deposited film. In some embodiments, pressure in a range from about 1000 Torr to about 10,000 Torr is applied during the annealing operation.

FIGS. 8A and 8B show phase change schemes of the metallic photoresist layer 15 by EUV or DUV exposure according to embodiments of the present disclosure.

In some embodiments, as shown in FIG. 8A, the bi-layer resist as shown in FIG. 7A or the multi-layer resist as shown in FIG. 7B is formed over the substrate or a target layer to be patterned formed over the substrate. After the exposure by the EUV or DUV radiation, the exposed regions corresponding to a mask pattern change into the crystalline phase as explained above depending on the ratio (e.g., thickness ratio) of the first metal and the second metal. The crystalline regions have a different etching rate or a dissolution rate to the wet and/or dry developer than the non-exposed regions, and the pattern corresponding to the photo mask is formed over the substrate after the development.

In some embodiments, as shown in FIG. 8B, the amorphous layer as shown in FIG. 7C or FIG. 7D is formed over the substrate or a target layer to be patterned formed over the substrate. After the exposure by the EUV or DUV radiation, the exposed regions corresponding to a mask pattern change into the crystalline phase as explained above depending on the ratio (e.g., thickness ratio) of the first metal and the second metal. The crystalline regions have a different etching rate or a dissolution rate to the wet and/or dry developer than the non-exposed regions, and the patterns corresponding to the photo mask are formed over the substrate after the development.

In some embodiments, during the EUV or DEV exposure, the metallic photo resist is optionally subjected to a heating operation at a temperature in a range from about 40° C. and about 1000° C., and in other embodiments, the heating temperature is in a range from about 150° C. to 300° C. In some embodiments, pressure in a range from about 1 Torr to about 100 Torr (He and/or $H_2$) is applied to the metallic photo resist during the exposure operation.

FIGS. 9A-9J shows various stages of a sequential manufacturing operation of a semiconductor device according to embodiments of the present disclosure. It is understood that additional operations can be provided before, during, and after the processes shown by FIGS. 9A-9J, and some of the operations described below are replaced or eliminated, for additional embodiments of the method. The order of the operations/processes may be interchangeable. Material, configuration, dimensions and/or processes the same as or similar to the foregoing embodiments described with FIGS. 1-8B may be employed in the following embodiments, and detailed explanation thereof may be omitted.

FIGS. 9A-9F show an operation in a case of a positive tone developer. As show in FIG. 9A, a target layer 12 to be patterned is formed over a substrate 10. In some embodiments, the target layer 12 is a conductive layer, such as a metal or metallic layer (Ti, TiN, Ta, TaN, W, Cu, Al, Co, Ni, Mo, Ru, or alloy thereof, or any suitable conductive material used in a semiconductor fabrication) or a semiconductor layer (amorphous, polycrystalline or crystalline Si, SiGe or Ge, doped or non-doped, or any suitable semiconductor material used in a semiconductor fabrication), or a dielectric layer, such as silicon oxide, silicon nitride, SiON, SiOC, SiOCN, SiCN, hafnium oxide, aluminum oxide or any suitable dielectric material used in a semiconductor fabrication. In some embodiments, a mask layer 14 is formed over the target layer 12. In some embodiments, the mask layer 14 includes a dielectric material, a semiconductor material or a conductive material sufficiently higher etching resistivity than the target layer 12. In some embodiments, the mask layer 14 is an organic bottom antireflective coating (BARC). Further, a metallic resist layer 15 is formed over the mask layer 14 as set forth above.

Figure 9B:
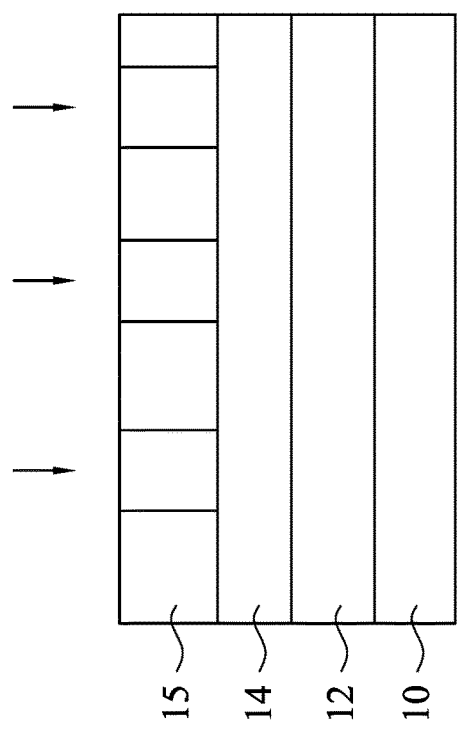
FIGS. 9A, 9B, 9C, 9D, 9E and 9F show various stages of a sequential manufacturing operation of a semiconductor device according to an embodiment of the present disclosure.
Figure 9D:
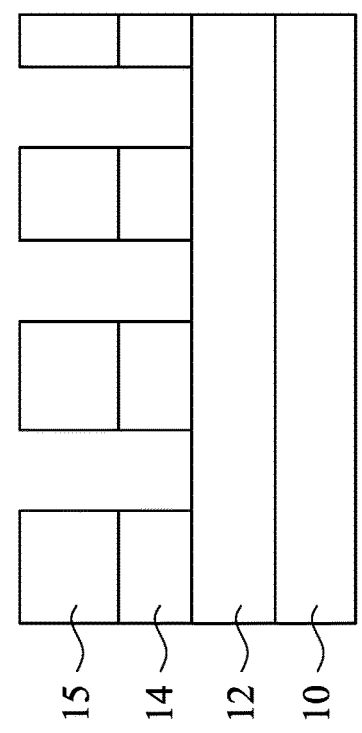
Figure 9A:
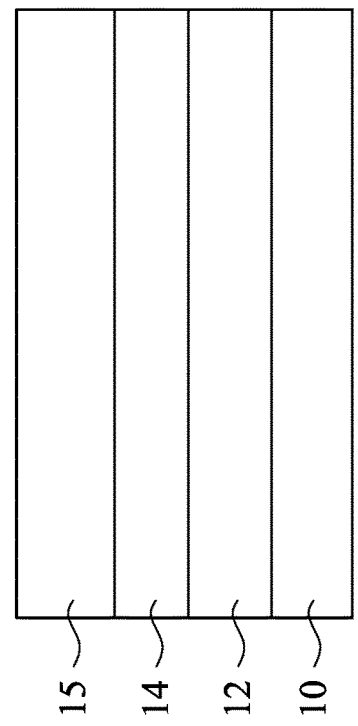
Figure 9C:
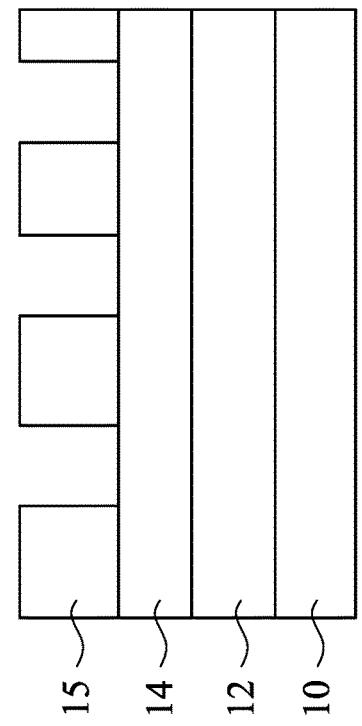
Figure 9F:
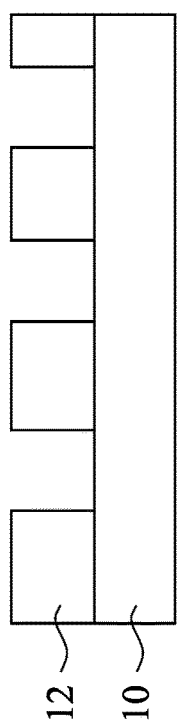
Figure 9E:
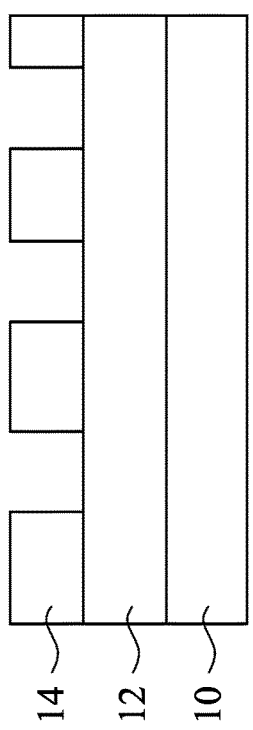

Then, as shown in FIG. 9B, an exposure operation is performed on the metallic resist layer 15 by the EUV or DUV radiation reflected by or a passing through a photo mask having circuit patterns. Then, as shown in FIG. 9C, the exposed metallic resist layer 15 is developed and removed by a wet developer or dry development. Next, as shown in FIG. 9D, the mask layer 14 is patterned by using the patterned metallic layer 15 as an etching mask. In some embodiments, the metallic resist layer 15 is then removed by using a suitable wet or dry etchant, as shown in FIG. 9E. Then, the target layer 12 is patterned by using the patterned mask layer 14 as an etching mask, and the mask layer 14 is removed, as shown in FIG. 9F. In some embodiments, the target layer 12 is patterned without removing the metallic resist layer 15. In some embodiments, the patterned mask layer 14 is not removed after the patterning of the target layer 12.

Figure 9G:
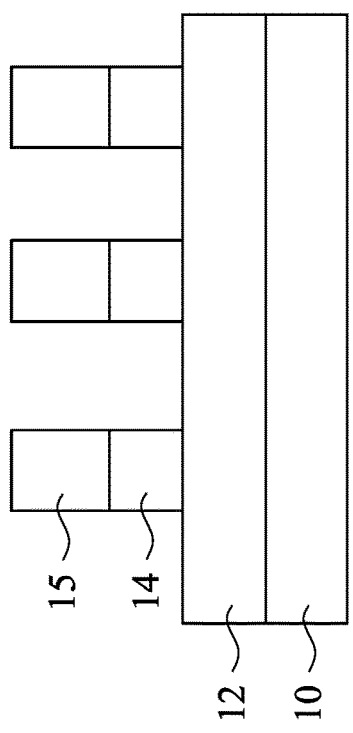
FIGS. 9G, 9H, 9I and 9J show various stages of a sequential manufacturing operation of a semiconductor device according to an embodiment of the present disclosure.
Figure 9H:
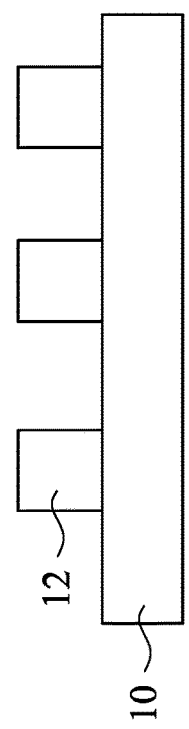
Figure 9I:
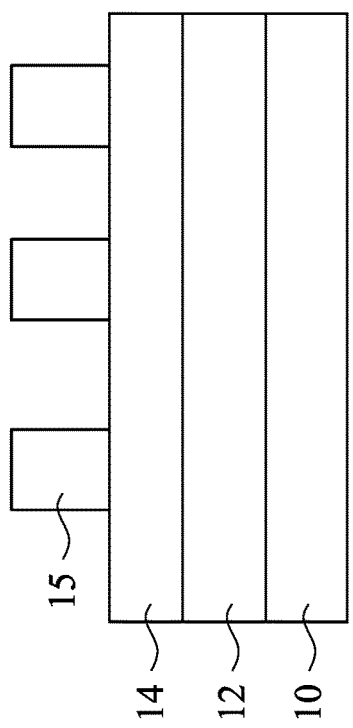
Figure 9J:
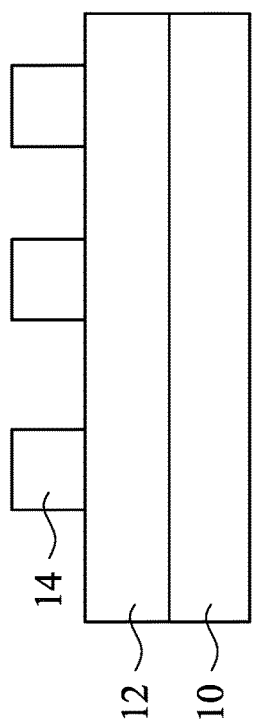

FIGS. 9G-9J show an operation in a case of a negative tone developer. As shown in FIG. 9G, the non-exposed regions of the metallic resist layer 15 are developed and removed by a wet developer or dry development. The operations of FIGS. 9H, 9I and 9J are the same as those of FIGS. 9D, 9E and 9F.

FIGS. 10-14 shows various stages of a sequential manufacturing operation of a semiconductor device according to an embodiment of the present disclosure. It is understood that additional operations can be provided before, during, and after the processes shown by FIGS. 10-14, and some of the operations described below are replaced or eliminated, for additional embodiments of the method. The order of the operations/processes may be interchangeable. Material, configuration, dimensions and/or processes the same as or similar to the foregoing embodiments described with FIGS. 1-9F may be employed in the following embodiments, and detailed explanation thereof may be omitted.

Figure 10:
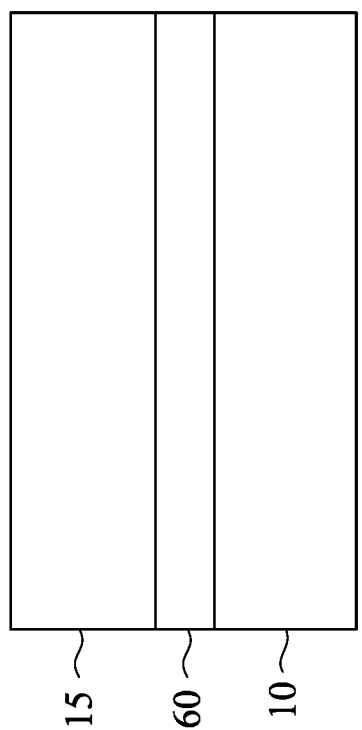
FIG. 10 shows a process stage of a sequential operation according to an embodiment of the disclosure.

In some embodiments, a layer to be patterned (target layer) 60 is disposed over the substrate prior to forming the photoresist layer, as shown in FIG. 10. In some embodiments, the layer to be patterned 60 is a metallization layer or a dielectric layer, such as a hard mask layer, an interlayer dielectric layer or a passivation layer, disposed over a metallization layer. In other embodiments, the target layer is a bottom antireflective coating (BARC) layer made of an organic polymer. In embodiments where the layer to be patterned 60 is a metallization layer, the layer to be patterned 60 is formed of a conductive material using metallization processes, and metal deposition techniques, including chemical vapor deposition, atomic layer deposition, and physical vapor deposition (sputtering). Likewise, if the layer to be patterned 60 is a dielectric layer, the layer to be patterned 60 is formed by dielectric layer formation techniques, including thermal oxidation, chemical vapor deposition, atomic layer deposition, and physical vapor deposition.

The photoresist layer 15 is subsequently selectively exposed to actinic radiation 45 to form exposed regions 50 and unexposed regions 52 in the photoresist layer, as shown in FIGS. 11A and 11B, and described herein in relation to FIGS. 3A and 3B. As explained herein the photoresist is a negative-tone photoresist in some embodiments.

Figure 12B:
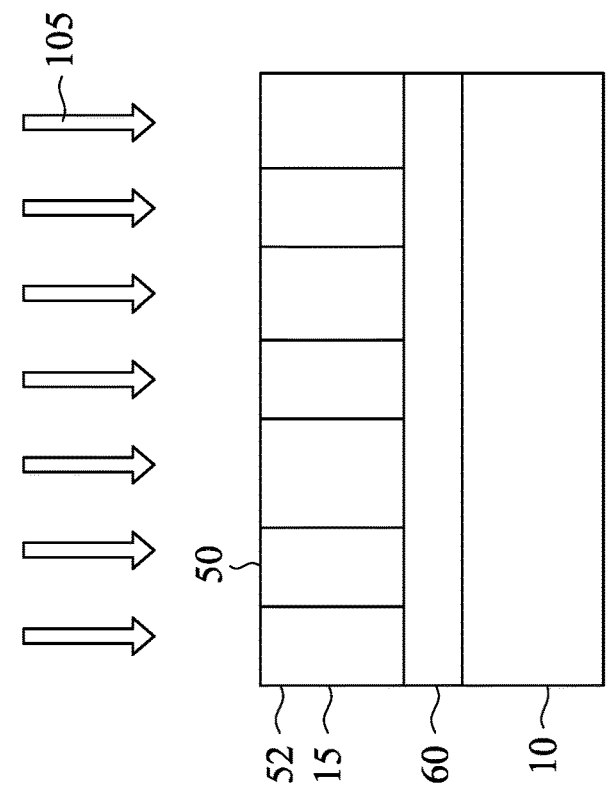
FIGS. 12A and 12B show a process stage of a sequential operation according to an embodiment of the disclosure.
Figure 12A:
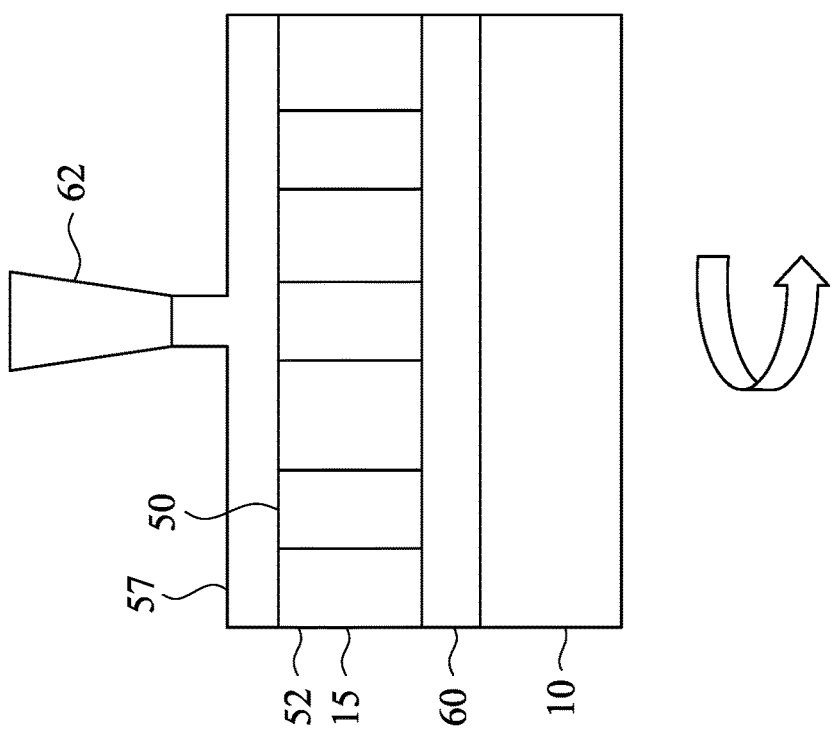
Figure 13:
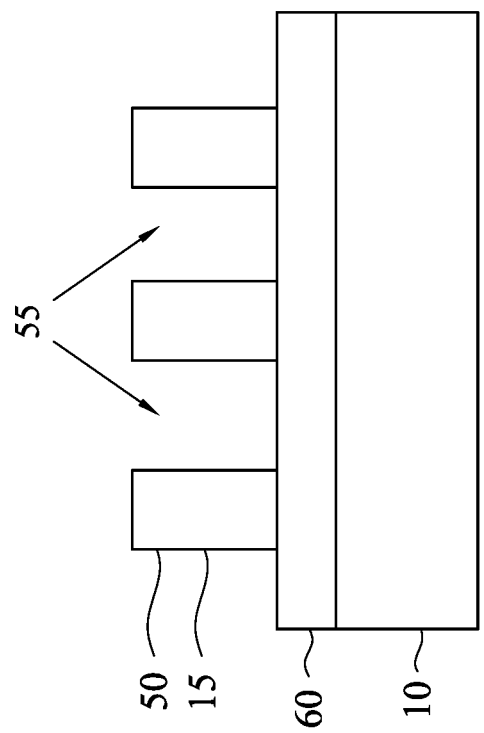
FIG. 13 shows a process stage of a sequential operation according to an embodiment of the disclosure.

The unexposed photoresist regions 52 are developed by dispensing developer 57 from a dispenser 62, as shown in FIG. 12A, or by a dry development operation, as shown in FIG. 12B to form a photoresist pattern 55, as shown in FIG. 13. The development operation is similar to that explained herein with reference to FIGS. 4A, 4B, and 5.

Figure 14:
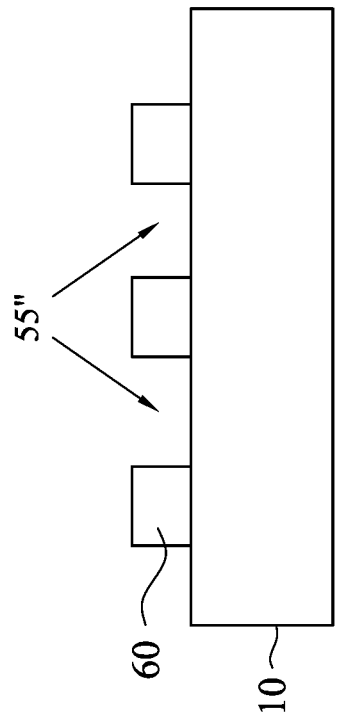
FIG. 14 shows a process stage of a sequential operation according to an embodiment of the disclosure.

Then as shown in FIG. 14, the pattern 55 in the photoresist layer 15 is transferred to the layer to be patterned 60 using an etching operation and the photoresist layer is removed, as explained with reference to FIG. 6 to form pattern 55" in the layer to be patterned 60.

Other embodiments include other operations before, during, or after the operations described above. In some embodiments, the disclosed methods include forming fin field effect transistor (FinFET) structures. In some embodiments, a plurality of active fins are formed on the semiconductor substrate. Such embodiments, further include etching the substrate through the openings of a patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/drain regions, contacts for gate/source/drain features, etc. In other embodiments, a target pattern is formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, other memory cells, and combinations thereof are formed, according to embodiments of the disclosure.

It will be understood that not all advantages have been necessarily discussed herein, no particular advantage is required for all embodiments or examples, and other embodiments or examples may offer different advantages.

The metallic photo resist layer as disclosed herein can be used to form patterns having a dimension of about 5 nm to about 40 nm and has a low line width roughness (LWR) and high etching selectivity, which is improved by about 20% compared with a polymer based photo resist.

In accordance with one aspect of the present disclosure, in a method of manufacturing a semiconductor device, a metallic photoresist layer is formed over a target layer to be patterned, the metallic photoresist layer is selectively exposed to actinic radiation to form a latent pattern, and the latent pattern is developed by applying a developer to the selectively exposed photoresist layer to form a pattern. The metallic photo resist layer is an alloy layer of two or more metal elements, and the selective exposure changes a phase of the alloy layer. In one or more of the foregoing or following embodiments, the alloy layer before the selective exposure is an amorphous, and the selective exposure changes the alloy layer to crystalline or polycrystalline. In one or more of the foregoing or following embodiments, the actinic radiation is extreme ultraviolet radiation. In one or more of the foregoing or following embodiments, the alloy layer includes two or more selected from the group consisting of Ag, Cd, In, Sn, Sb, Te, Cs, Au, Hg, Tl, Pb, Bi, Po and At. In one or more of the foregoing or following embodiments, the alloy layer includes Sn and one or more selected from the group consisting of Sb, In, Te and Ag. In one or more of the foregoing or following embodiments, the metallic photoresist layer is deposited over the target layer by atomic layer deposition (ALD), chemical vapor deposition (CVD) or physical vapor deposition (PVD). In one or more of the foregoing or following embodiments, the metallic photoresist layer is deposited over the target layer by sputtering as PVD using a target comprising an alloy having a same elemental composition as the alloy layer. In one or more of the foregoing or following embodiments, the metallic photoresist layer is deposited over the target layer by sputtering as PVD using two or more targets corresponding the two or more metal elements of the alloy layer.

In accordance with another aspect of the present disclosure, in a method of manufacturing a semiconductor device, a metallic photoresist layer is formed over a target layer to be patterned, the metallic photoresist layer is selectively exposed to actinic radiation to form a latent pattern, and the latent pattern is developed by applying a developer to the selectively exposed photoresist layer to form a pattern. The metallic photo resist layer includes two or more layers of a first layer made of a first metal element and a second layer made of a second metal element different from the first metal element, and the selective exposure converts the two or more layers into an alloy layer of the first metal element and the second metal element. In one or more of the foregoing or following embodiments, the alloy layer is crystalline or polycrystalline. In one or more of the foregoing or following embodiments, the first metal element and the second metal element are selected from the group consisting of Ag, Cd, In, Sn, Sb, Te, Cs, Au, Hg, Tl, Pb, Bi, Po and At. In one or more of the foregoing or following embodiments, the first metal element is Sn and the second metal element is one selected from the group consisting of Sb, In, Te and Ag. In one or more of the foregoing or following embodiments, the metallic photoresist layer is deposited over the target layer by atomic layer deposition (ALD), chemical vapor deposition (CVD) or physical vapor deposition (PVD). In one or more of the foregoing or following embodiments, the metallic photoresist layer consists of one layer of the first metal element and one layer of the second metal element. In one or more of the foregoing or following embodiments, the metallic photoresist layer consists of two or more layers of the first metal element and one or more layers of the second metal element.

In accordance with another aspect of the present disclosure, in a method of manufacturing a semiconductor device, a metallic photoresist layer is formed over a target layer to be patterned, the metallic photoresist layer is selectively exposed to actinic radiation to form a latent pattern, and the latent pattern is developed by applying a developer to the selectively exposed photoresist layer to form a pattern. The metallic photo resist layer includes one or more metal or metal alloy layers, and the one or more metal or metal alloy layers includes two or more selected from the group consisting of In, Sn, Sb, Te, and Ag. In one or more of the foregoing or following embodiments, the developer is a liquid developer comprising one or more solvents selected from the group consisting of dimethyl sulfoxide, acetone, ethylene glycol, methanol, ethanol, propanol, propanediol, water, 4-methyl-2-pentanone, hydrogen peroxide, isopropyl alcohol and butyldiglycol. In one or more of the foregoing or following embodiments, the liquid developer further comprises one or more acids selected from the group consisting of acetic acid, ethanedioic acid, methanoic acid, 2-hydroxypropanoic acid, 2-hydroxybutanedioic acid, citric acid, uric acid, trifluoromethanesulfonic acid, benzenesulfonic acid, ethanesulfonic acid, methanesulfonic acid, oxalic acid, maleic acid, carbonic acid, oxoethanoic acid, 2-hydroxyethanoic acid, propanedioic acid, butanedioic acid, 3-oxobutanoic acid, hydroxylamine-O-sulfonic acid, formamidinesulfinic acid, methylsulfamic acid, sulfoacetic acid, 1,1,2,2-tetrafluoroethanesulfonic acid, 1,3-propanedisulfonic acid, nonafluorobutane-1-sulfonic acid, benzenesulfonic acid and 5-sulfosalicylic acid, $HNO_3$, $H_2SO_4$, HCl, and $H_3PO_4$. In one or more of the foregoing or following embodiments, the liquid developer further comprises one or more bases selected from the group consisting of monoethanolamine, monoisopropanolamine, 2-amino-2-methyl-1-propanol, 1H-benzotriazole, 1,2,4-triazole, 1,8-diazabicycloundec-7-ene, tetrabutylammonium hydroxide, tetramethylammonium hydroxide, ammonium hydroxide, ammonium sulfamate, ammonium carbamate, tetraethylammonium hydroxide and tetrapropylammonium hydroxide. In one or more of the foregoing or following embodiments, the developer is a vapor developer comprising at least one selected from the group consisting of $Cl_2$, $CHCl_3$, $CH_2Cl_2$, $CH_4$, $CF_4$, $N_2$, $BCl_3$, $CCl_4$, HCl, $O_2$, $NF_3$, $NH_3$, $N_2H_2$, HBr and $NO_2$.

In accordance with another aspect of the present disclosure, a photoresist developer includes a first solvent having Hansen solubility parameters of $5<\delta_d<35$, $5<\delta_p<35$, and $5<\delta_h<45$, an acid having an acid dissociation constant, pKa, of $-45<pKa<6.9$, or a base having a pKa of $45>pKa>7.1$, and a chelate. In one or more of the foregoing or following embodiments, a concentration of the first solvent is from 70 wt. % to 99 wt. % based on the total weight of the photoresist developer. In one or more of the foregoing or following embodiments, a concentration of the acid or base is from 0.001 wt. % to 30 wt. % based on the total weight of the photoresist developer. In one or more of the foregoing or following embodiments, a concentration of the chelate is 0.00 wt. % to 15 wt. % based on the total weight of the photoresist developer. In one or more of the foregoing or following embodiments, the photoresist developer further includes a surfactant. In one or more of the foregoing or following embodiments, a concentration of the surfactant is from 0.001 wt. % to 3 wt. % based on the total weight of the photoresist developer. In one or more of the foregoing or following embodiments, the photoresist developer further includes a second solvent different from the first solvent. In one or more of the foregoing or following embodiments, the concentration of the second solvent is from 1 wt. % to 40 wt. % based on the total weight of the developer. In one or more of the foregoing or following embodiments, the photoresist developer further includes hydrogen peroxide. In one or more of the foregoing or following embodiments, the first solvent is at least one selected from the group consisting of dimethyl sulfoxide, acetone, ethylene glycol, methanol, ethanol, propanol, propanediol, water, 4-methyl-2-pentanone, hydrogen peroxide, isopropyl alcohol and butyldiglycol. In one or more of the foregoing or following embodiments, the photoresist developer includes the acid, which is at least one selected selected from the group consisting of acetic acid, ethanedioic acid, methanoic acid, 2-hydroxypropanoic acid, 2-hydroxybutanedioic acid, citric acid, uric acid, trifluoromethanesulfonic acid, benzenesulfonic acid, ethanesulfonic acid, methanesulfonic acid, oxalic acid, maleic acid, carbonic acid, oxoethanoic acid, 2-hydroxyethanoic acid, propanedioic acid, butanedioic acid, 3-oxobutanoic acid, hydroxylamine-O-sulfonic acid, formamidinesulfinic acid, methylsulfamic acid, sulfoacetic acid, 1,1,2,2-tetrafluoroethanesulfonic acid, 1,3-propanedisulfonic acid, nonafluorobutane-1-sulfonic acid, benzenesulfonic acid and 5-sulfosalicylic acid, $HNO_3$, $H_2SO_4$, HCl, and $H_3PO_4$. In one or more of the foregoing or following embodiments, the photoresist developer comprises the base, which at least one selected from the group consisting of monoethanolamine, monoisopropanolamine, 2-amino-2-methyl-1-propanol, 1H-benzotriazole, 1,2,4-triazole, 1,8-diazabicycloundec-7-ene, tetrabutylammonium hydroxide, tetramethylammonium hydroxide, ammonium hydroxide, ammonium sulfamate, ammonium carbamate, tetraethylammonium hydroxide and tetrapropylammonium hydroxide. In one or more of the foregoing or following embodiments, the chelate is at least one selected from the group consisting of ethylenediaminetetraacetic acid (EDTA), ethylenediamine-N,N'-disuccinic acid (EDDS), diethylenetriaminepentaacetic acid (DTPA), polyaspartic acid, trans-1,2-cyclohexanediamine-N,N,N',N'tetraacetic acid monohydrate, and ethylenediamine.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a metallic photoresist layer, which is an alloy layer of two or more metal elements, over a target layer to be patterned;
    selectively exposing the metallic photoresist layer to actinic radiation to form a latent pattern by changing a phase of an exposed portion of the alloy layer; and
    developing the latent pattern by applying a developer to the selectively exposed photoresist layer to form a pattern,
    wherein the metallic photoresist layer is deposited over the target layer by physical vapor deposition (PVD).

2. The method according to claim 1, wherein:
    the alloy layer before the selective exposure is an amorphous layer, and
    the selective exposure changes the exposed portion of the alloy layer to crystalline or polycrystalline.

3. The method according to claim 2, wherein the actinic radiation is extreme ultraviolet radiation.

4. The method according to claim 2, wherein the alloy layer includes two or more selected from the group consisting of Ag, Cd, In, Sn, Sb, Te, Cs, Au, Hg, Tl, Pb, Bi, Po and At.

5. The method according to claim 2, wherein the alloy layer includes Sn and one or more selected from the group consisting of Sb, In, Te and Ag.

6. The method according to claim 1, wherein the metallic photoresist layer includes no organic material or no polymer.

7. The method according to claim 6, wherein the metallic photoresist layer is deposited over the target layer by sputtering as PVD using a target comprising an alloy having a same elemental composition as the alloy layer.

8. The method according to claim 6, wherein the metallic photoresist layer is deposited over the target layer by sputtering as PVD using two or more targets corresponding to the two or more metal elements of the alloy layer.

9. A method of manufacturing a semiconductor device, comprising:
    forming a metallic photoresist layer over a target layer to be patterned;
    selectively exposing the metallic photoresist layer to actinic radiation to form a latent pattern; and
    developing the latent pattern by applying a developer to the selectively exposed photoresist layer to form a pattern,
    wherein the metallic photo resist layer includes two or more layers of a first layer made of a first metal element and a second layer made of a second metal element different from the first metal element, and
    the selective exposure converts exposed portions of the two or more layers into an alloy layer of the first metal element and the second metal element.

10. The method according to claim 9, wherein the alloy layer is crystalline or polycrystalline.

11. The method according to claim 9, wherein the first metal element and the second metal element are selected from the group consisting of Ag, Cd, In, Sn, Sb, Te, Cs, Au, Hg, Tl, Pb, Bi, Po and At.

12. The method according to claim 9, wherein the first metal element is Sn and the second metal element is one selected from the group consisting of Sb, In, Te and Ag.

13. The method according to claim 9, wherein the metallic photoresist layer is deposited over the target layer by atomic layer deposition (ALD), chemical vapor deposition (CVD) or physical vapor deposition (PVD).

14. The method according to claim 9, wherein the metallic photoresist layer consists of one layer of the first metal element and one layer of the second metal element.

15. The method according to claim 9, wherein the metallic photoresist layer consists of two or more layers of the first metal element and one or more layers of the second metal element.

16. A method of manufacturing a semiconductor device, comprising:
forming a metallic photoresist layer over a target layer to be patterned;
selectively exposing the metallic photoresist layer to actinic radiation to form a latent pattern; and
developing the latent pattern by applying a developer to the selectively exposed photoresist layer to form a pattern,
wherein the metallic photo resist layer includes one selected from the group consisting of an alloy including 47-49 atomic % of Sn and 51-53 atomic % of Sb, an alloy including 56-58 atomic % of Sn and 42-44 atomic % of Sb, an alloy including 9-16 atomic % of Sn and 84-91 atomic % of Ag, an alloy including 24-26 atomic % of Sn and 74-76 atomic % of Ag, an alloy including 48-52 atomic % of Sn and 48-52 atomic % of Te, an alloy including 9-16 atomic % of Sb and 84-91 atomic % of Ag, an alloy including 22-26 atomic % of Sb and 74-78 atomic % of Ag, an Ag—Sb—Sn alloy including 0.1-75 atomic % of Ag, and an alloy of Sn and In.

17. The method according to claim 16, wherein the developer is a liquid developer comprising one or more solvents selected from the group consisting of dimethyl sulfoxide, acetone, ethylene glycol, methanol, ethanol, propanol, propanediol, water, 4-methyl-2-pentanone, hydrogen peroxide, isopropyl alcohol and butyldiglycol.

18. The method according to claim 17, wherein the liquid developer further comprises one or more acids selected from the group consisting of acetic acid, ethanedioic acid, methanoic acid, 2-hydroxypropanoic acid, 2-hydroxybutanedioic acid, citric acid, uric acid, trifluoromethanesulfonic acid, benzenesulfonic acid, ethanesulfonic acid, methanesulfonic acid, oxalic acid, maleic acid, carbonic acid, oxoethanoic acid, 2-hydroxyethanoic acid, propanedioic acid, butanedioic acid, 3-oxobutanoic acid, hydroxylamine-O-sulfonic acid, formamidinesulfinic acid, methylsulfamic acid, sulfoacetic acid, 1,1,2,2-tetrafluoroethanesulfonic acid, 1,3-propanedisulfonic acid, nonafluorobutane-1-sulfonic acid, benzenesulfonic acid and 5-sulfosalicylic acid, $HNO_3$, $H_2SO_4$, HCl, and $H_3PO_4$.

19. The method according to claim 17, wherein the liquid developer further comprises one or more bases selected from the group consisting of monoethanolamine, monoisopropanolamine, 2-amino-2-methyl-1-propanol, 1H-benzotriazole, 1,2,4-triazole, 1,8-diazabicycloundec-7-ene, tetrabutylammonium hydroxide, tetramethylammonium hydroxide, ammonium hydroxide, ammonium sulfamate, ammonium carbamate, tetraethylammonium hydroxide and tetrapropylammonium hydroxide.

20. The method according to claim 16, wherein the developer is a vapor developer comprising at least one selected from the group consisting of $Cl_2$, $CHCl_3$, $CH_2Cl_2$, $CH_4$, $CF_4$, $N_2$, $BCl_3$, $CCl_4$, HCl, $O_2$, $NF_3$, $NH_3$, $N_2H_2$, HBr and $NO_2$.

* * * * *